(12) United States Patent
Hu et al.

(10) Patent No.: US 9,553,361 B2
(45) Date of Patent: Jan. 24, 2017

(54) BALANCED ANTENNA SYSTEM

(75) Inventors: Zhen Hua Sampson Hu, Heshan (CN); Peter Hall, Birmingham (GB)

(73) Assignee: SMART ANTENNA TECHNOLOGIES LTD, Birmingham (GB)

( * ) Notice: Subject to any disclaimer, the term of this patent is extended or adjusted under 35 U.S.C. 154(b) by 509 days.

(21) Appl. No.: 13/990,189

(22) PCT Filed: Nov. 11, 2011

(86) PCT No.: PCT/GB2011/001598
§ 371 (c)(1),
(2), (4) Date: Jul. 26, 2013

(87) PCT Pub. No.: WO2012/072969
PCT Pub. Date: Jun. 7, 2012

(65) Prior Publication Data
US 2013/0307742 A1    Nov. 21, 2013

(30) Foreign Application Priority Data

Nov. 29, 2010 (GB) .................................. 1020202.6
May 19, 2011 (GB) .................................. 1108456.3

(51) Int. Cl.
*H01Q 1/50* (2006.01)
*H01Q 1/24* (2006.01)
(Continued)

(52) U.S. Cl.
CPC .............. *H01Q 1/50* (2013.01); *H01Q 1/243* (2013.01); *H01Q 1/521* (2013.01); *H01Q 9/265* (2013.01);
(Continued)

(58) Field of Classification Search
CPC .... H01Q 1/243; H01Q 9/265; H01Q 21/0006; H03H 7/38; H03H 7/465
(Continued)

(56) References Cited

U.S. PATENT DOCUMENTS 2,165,086 A   7/1939  Andrew
2,871,306 A   1/1959  Waring
(Continued)

FOREIGN PATENT DOCUMENTS

CN   1440090   9/2003
CN   1647315   7/2005
(Continued)

OTHER PUBLICATIONS

International Search Report issued in Int'l Pat. Appl. No. PCT/GB2011/001598 dated Mar. 19, 2012.
(Continued)

*Primary Examiner* — Hoanganh Le
(74) *Attorney, Agent, or Firm* — Barnes & Thornburg LLP

(57) ABSTRACT

The invention relates to a balanced antenna system comprising a radiator connected via a matching circuit to a balun. In certain embodiments, the radiator comprises a first radiating element and a second radiating element and the matching circuit comprises a first impedance-matching circuit connected to the first radiating element and a second impedance-matching circuit connected to the second radiating element. The first and second matching circuits may be identical and are connected through the balun to a single port. To minimize the component count, the design of the matching circuit and balun is co-optimized.

32 Claims, 19 Drawing Sheets

(51) Int. Cl.
*H01Q 1/52* (2006.01)
*H01Q 9/26* (2006.01)
*H01Q 21/28* (2006.01)
*H03H 7/38* (2006.01)
*H03H 7/42* (2006.01)
*H03H 7/46* (2006.01)
*H01Q 21/00* (2006.01)

(52) U.S. Cl.
CPC .......... *H01Q 21/0006* (2013.01); *H01Q 21/28* (2013.01); *H03H 7/38* (2013.01); *H03H 7/42* (2013.01); *H03H 7/465* (2013.01)

(58) Field of Classification Search
USPC ........ 343/821, 852, 853, 855, 859, 860, 865
See application file for complete search history.

(56) References Cited

U.S. PATENT DOCUMENTS

| | | | |
|---|---|---|---|
| 3,846,721 | A | 11/1974 | Fritz et al. |
| 4,495,505 | A | 1/1985 | Shields |
| 5,148,130 | A | 9/1992 | Dietrich |
| 5,528,252 | A | 6/1996 | Skahill |
| 6,362,792 | B1 | 3/2002 | Sawamura et al. |
| 2004/0169566 | A1 | 9/2004 | Guitton et al. |
| 2005/0083162 | A1* | 4/2005 | Wang ............... H03H 7/42 336/232 |
| 2008/0158084 | A1 | 7/2008 | Rofougaran |
| 2009/0079516 | A1* | 3/2009 | Miyata ............ H01F 17/0013 333/175 |
| 2010/0109798 | A1* | 5/2010 | Chu ................. H03H 7/38 333/124 |
| 2013/0027272 | A1* | 1/2013 | Karthaus ............. H01Q 1/246 343/850 |
| 2013/0130631 | A1* | 5/2013 | Song ................... H04B 1/48 455/78 |
| 2014/0361834 | A1* | 12/2014 | Fritz .................. H03H 7/42 330/275 |

FOREIGN PATENT DOCUMENTS

| | | |
|---|---|---|
| DE | 3628024 | 2/1988 |
| EP | 0685936 | 12/1995 |
| EP | 0809321 | 11/1997 |
| EP | 1339131 | 8/2003 |
| EP | 1659686 | 5/2006 |
| EP | 1901395 | 3/2008 |
| JP | 2005020677 | 1/2005 |
| JP | 2005198167 | 7/2005 |
| JP | 2008017384 | 1/2008 |
| WO | WO 01/57950 | 8/2001 |
| WO | WO 2007/128598 | 11/2007 |

OTHER PUBLICATIONS

Search Report issued in Application No. GB1020202.6, dated Apr. 15, 2011.
Yeh et al., "Compact 28-GHz Subharmonically Pumped Resistive Mixer MMIC Using a Lumped-Element High-Pass/Band-Pass Balun", *IEEE Microwave and Wireless Components Letters*, IEEE Service Center, New York, NY, 15:2, 62-64 (2005).
Iizuka et al., "Stub- and Capacitor-Loaded Folded Dipole Antenna for Digital Terrestrial TV Reception", *IEEE Transactions on Antennas and Propagation*, IEEE Service Center, Piscataway, NJ, 56:1, 215-222 (2008).
Office Action issued in Chinese Patent Application No. 201180066248.2, dated Mar. 20, 2015.

\* cited by examiner

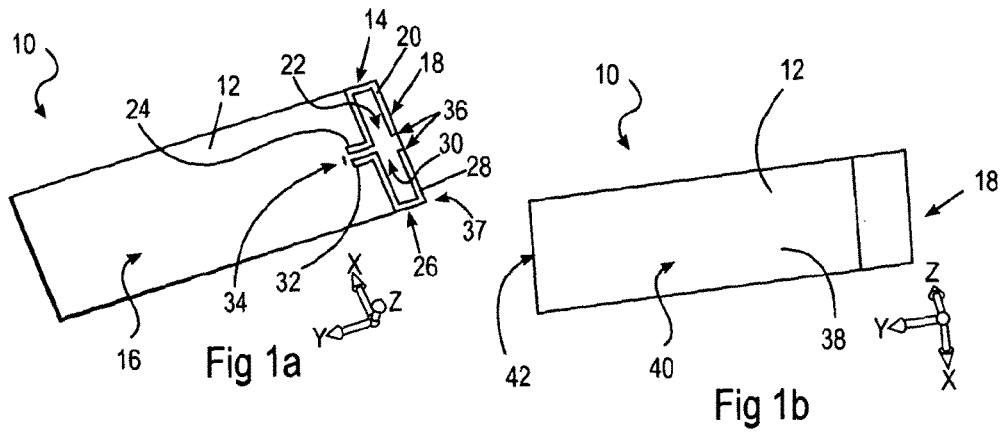
Fig 1a
Fig 1b
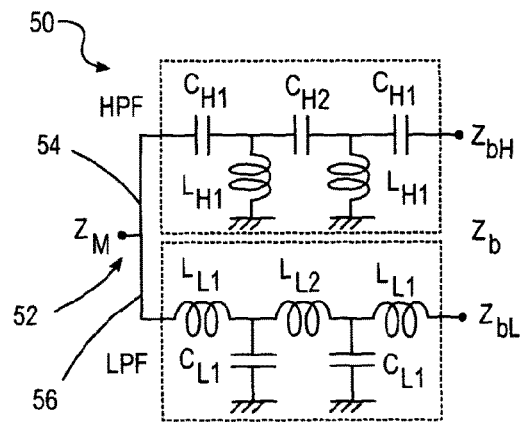
Fig 2
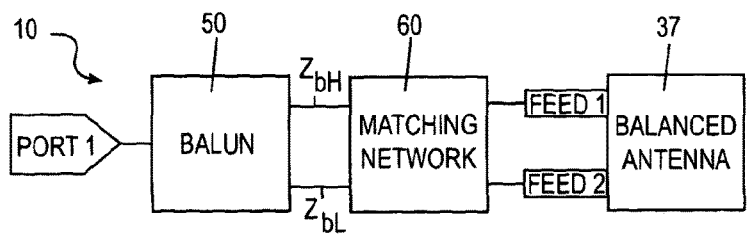
Fig 3
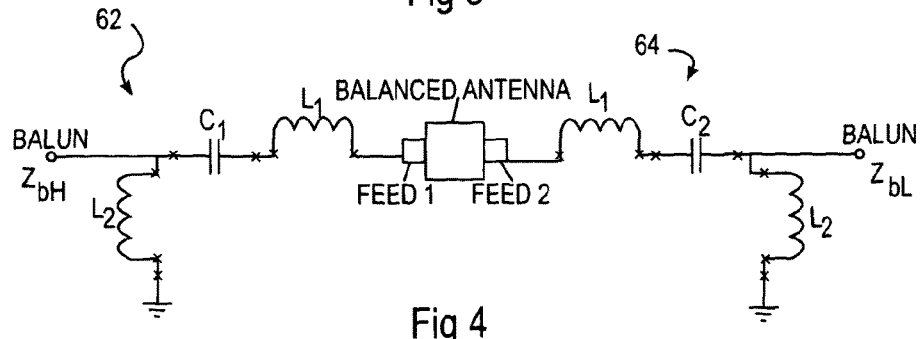
Fig 4

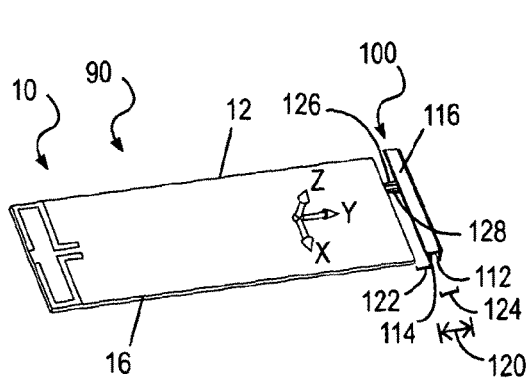
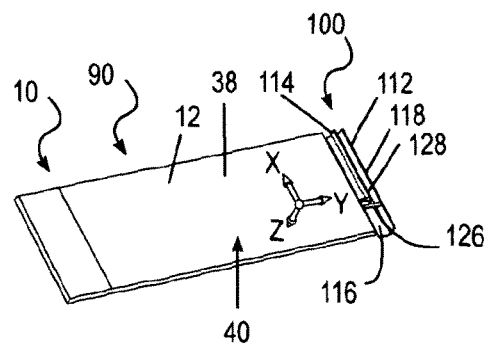
Fig 9A    Fig 9B
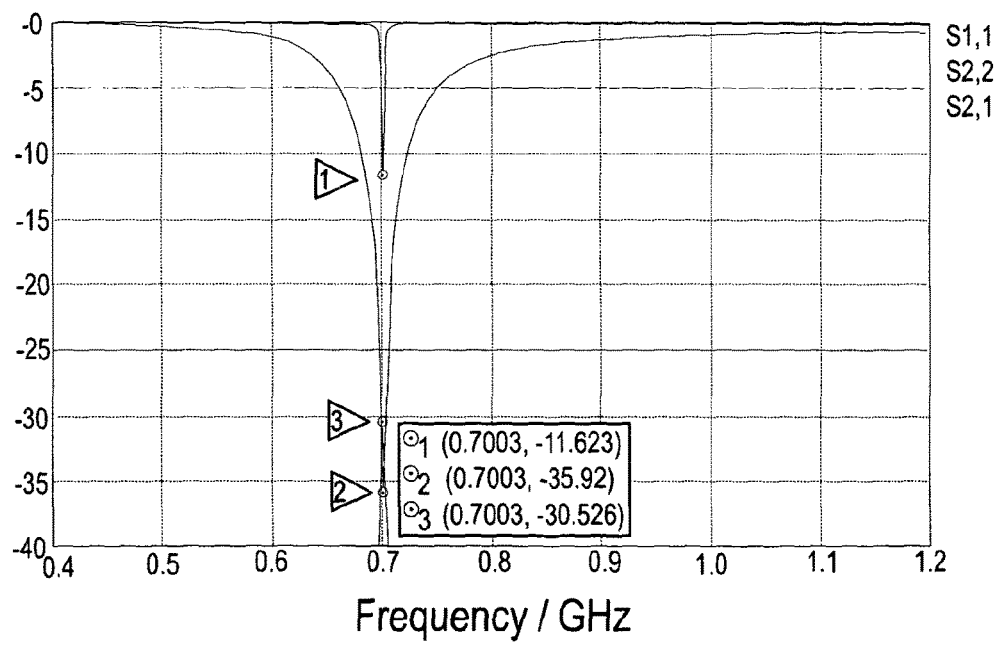
Fig 10

BALANCED ANTENNA SYSTEM

The present application is a U.S. nationalization under 35 U.S.C. §371 of International Application No. PCT/GB2011/001598, filed Nov. 11, 2011, which claims priority to United Kingdom Patent Application No. 1020202.6, filed Nov. 29, 2010, and United Kingdom Application No. 1108456.3, filed May 19, 2011. The disclosures set forth in the referenced patent applications are incorporated herein by reference in their entireties.

FIELD OF THE INVENTION

The invention relates to a balanced antenna system. Particularly, but not exclusively, the invention relates to a balanced antenna system for use in a portable electronic device such as a mobile telephone, laptop, personal digital assistant (PDA) or radio.

BACKGROUND TO THE INVENTION

Multiple-input-multiple-output (MIMO) wireless systems exploiting multiple antennas for transmitting and/or receiving data have attracted increasing interest due to their potential for increased capacity in rich multipath environments. Such systems can be used to enable enhanced communication performance (i.e. improved signal quality and reliability) by use of multi-path propagation without requiring additional spectrum bandwidth. This has been a well-known and well-used solution to achieve high data rate communications employing either 2G or 3G communication standards.

For indoor wireless applications such as router devices, external dipole and monopole antennas are widely used with high-gain, omni-directional dipole arrays and collinear antennas being the most popular.

However, there are very few portable devices with MIMO systems on the market and this is mainly because of the complications around gathering several radiators in a small device (due to the small allocated space of the terminal), while maintaining the required isolation between each radiator.

One of the interesting solutions to this problem involves the use of balanced radiators which do not require a ground plane (and especially ground plane currents) to efficiently radiate. Over recent years, balanced antenna systems have attracted increasing interest to mobile phone antenna designers because of their stable performance when held adjacent to the human body. In this type of antenna, only balanced currents flow on the antenna element, thus remarkably reducing the effect of current flow on the phone chassis and the influence of the human body on antenna performance can be made small.

The structure of a balanced antenna system typically comprises a radiating element which is fed by a balanced line or "balun" (which is configured to convert a single unbalanced signal into two differential balanced signals or vice versa). Such balanced antennas have been successfully applied to design a two-element structure which operates at 2.45 GHz and 5.2 GHz in PDA and laptop devices. However, it is currently considered difficult (or perhaps even impossible) to implement such structures at lower frequencies; for instance in either DVB-H, GSM or UMTS mobile phones because of the physical size of the corresponding resonance.

There is therefore a need for a compact balanced antenna design for MIMO applications in mobile devices which can provide coverage across the whole spectrum of frequency ranges required by service providers and customers. Consequently, an aim of the present invention is to provide a balanced antenna system which helps to address the above-mentioned problems.

SUMMARY OF THE INVENTION

According to a first aspect of the present invention there is provided a balanced antenna system comprising a radiator connected via a matching circuit to a balun.

Embodiments of the invention therefore provide a balanced antenna system which has a simple structure and is capable of operating at a single resonance over a range of different frequencies. The fact that the matching circuit is incorporated between the balun and the radiator allows for greater flexibility and control of the radiator, leading to greater tuning capacity.

The radiator may be constituted by a loop or a dipole antenna and may comprise a first feed line and a second feed line. In certain embodiments, the radiator may comprise a first radiating element and a second radiating element. The radiator may be configured to provide a single resonant frequency or it may be configured to provide two, three of more resonant frequencies simultaneously. Accordingly, it may be possible to configure a single antenna system to cover a wide range of frequencies.

The matching circuit may comprise a first impedance-matching circuit and a second impedance-matching circuit. The first impedance-matching circuit may be connected to the first feed line and/or the first radiating element and a second impedance-matching circuit may be connected to the second feed line and/or the second radiating element.

The first and second matching circuits may be identical and may be connected through the balun to a single port. To minimise the component count, the design of the matching circuit and balun may be co-optimised.

It is noted that previous reconfigurable balanced antennas have incorporated varactors or switches on each arm of the balanced radiating elements. By contrast, the proposed balanced antenna may incorporate two identical external matching circuits, one for each radiating element, and a balun circuit, which has not been proposed previously in the literature.

The balun may be configured to convert unbalanced signals to balanced signals by cancelling or choking an outside current. Several types of balun are known for use with dipole antennas. These include so-called current baluns, coax baluns and sleeve baluns —any of which could be employed in embodiments of the present invention. In a particular embodiment, however, it is desirable to employ a wideband LC balun, configured for impedance transformation, so as to provide a balanced antenna system with a wide tuning range.

The balun may comprise a first filter and a second filter. The first impedance-matching circuit may be provided between the first filter and the first radiating element and the second impedance-matching circuit may be provided between the second filter and the second radiating element.

In a specific embodiment, the balun may comprise a high pass filter (first filter), a low pass filter (second filter) and a T-junction. In an alternative embodiment, the balun may comprise a high pass filter (first filter) and a band pass filter (second filter) connected in parallel.

The first filter may comprise at least one capacitor and the second filter may comprise at least one inductor.

The high pass filter and/or the low/band pass filter may each comprise one or more than one inductor or capacitor (e.g. in the form of an L-C circuit). In certain embodiments the high pass filter may comprise one or more than one (e.g. three) capacitors connected in series and none, one or more than one (e.g. two) inductors connected in parallel and the low pass filter may comprise one or more than one (e.g. three) inductors connected in series and none, one or more than one (e.g. two) capacitors connected in parallel. In alternative embodiments, the high pass filter may comprise an inductor and a capacitor and the band pass filter may comprise a plurality of inductors and a plurality of capacitors. The first filter and the second filter may be connected in parallel.

In certain balun configurations, the number of components in each of the first and second filters may correspond to a magnitude of order, with more order in the filter providing a wider bandwidth with phase difference. In particular configurations, the balun may comprise a filter having one, two or more (e.g. five) orders (i.e. by each comprising one, two or more components). However, the Applicants have also found that in certain embodiments of the present invention, the performance of the balun itself is not so critical and simply employing one inductor (or capacitor) in each filter can be sufficient.

In certain embodiments of the invention, at least one alternative component may be provided for inclusion in the first filter and/or second filter. At least one switch may be provided to enable the at least one alternative component to be activated in place of another component.

In certain embodiments of the invention, a second high pass filter and/or a second low pass filter may be provided. At least one switch may be provided to enable the second high pass filter and/or the second low pass filter to be activated in place of the respective high pass filter and/or low pass filter.

The second high pass filter and/or the second low pass filter may comprise one or more than one inductor or capacitor (e.g. in the form of an L-C circuit). For example, the second high pass filter may comprise three capacitors connected in series and two inductors connected in parallel and the second low pass filter may comprise three inductors connected in series and two capacitors connected in parallel. However, it will be understood that the second high pass filter will have at least one component that is different to the high pass filter and the second low pass filter will have at least one component that is different to the low pass filter. In certain embodiments, all components of the second high pass filter will be different to those of the high pass filter and/or all components of the second low pass filter will be different to those of the low pass filter.

The first and/or second matching circuits may be reconfigurable to enable the respective first and/or second radiating elements to be tuned to different frequencies. The first and/or second matching circuits may comprise one or more than one inductor or capacitor (e.g. in the form of an L-C circuit) and may comprise a variable capacitor (i.e. varactor).

In embodiments of the present invention, the first and second matching circuits may be structurally identical (i.e. having the same components arranged in the same manner). It will be understood that such an arrangement can provide very good resonance although different matching circuits may also be employed in certain circumstances.

In a particular embodiment, the first and/or second matching circuit comprises a first inductor, a capacitor and a second inductor. The first inductor may be connected in parallel with the capacitor and the second inductor may be connected in series with the capacitor. The first inductor may be connected to a ground plane and the capacitor may be tunable.

In certain embodiments of the invention, at least one alternative component may be provided for inclusion in the first and/or second matching circuit. At least one switch may be provided to enable the at least one alternative component to be activated in place of another component.

In certain embodiments, the first inductor may be selectable from a group of at least two possible inductors and the second inductor may be selectable from a group of at least two other possible inductors.

It will be understood that the provision of alternative components for the balun and/or the first/second matching circuits allows greater flexibility in the configuration of the antenna and therefore allows the tuning range of the antenna to be greatly increased.

The first radiating element may be constituted by a first strip (e.g. of metal) which is substantially U-shaped or L-shaped and is provided on a first side of a substrate (e.g. printed circuit board, PCB), at a first end thereof. The U-shaped or L-shaped strip may be located in one half of the first end portion of the substrate and may be orientated such that its open end/side faces inwardly towards the central region of the first end portion. A short feed line may be provided at a start of the U-shaped or L-shaped strip closest to the centre of the substrate and extending along the length of the substrate.

The second radiating element may be substantially similar to the first radiating element and also provided on the first side of the substrate but orientated in an adjacent half of the first end portion of the substrate, opposite to the first radiating element, such that the open end/side of the second strip faces the open end/side of the first strip.

A gap may be provided between the respective feed lines of the first and second radiating elements and between the respective ends of the first and second strips.

A ground plane may be provided on a second side of the substrate, opposite the first side. The ground plane may be substantially rectangular and may occupy substantially the whole of the substrate surface from a second end thereof (opposite to the first end) to a position opposite the free ends of the feed lines.

The substrate may be of any convenient size and in one embodiment may have a surface area of approximately 116×40 mm$^2$ so that it can easily be accommodated in a conventional mobile device. It will be understood that the thickness of the substrate is not limited but will typically be a few millimeters thick (e.g. 1 mm, 1.5 mm, 2 mm or 2.5 mm).

In an embodiment of the invention, the first and second radiating elements may extend over an area of approximately 40×10 mm$^2$. It will be understood that the size of the radiator is not limited and can be increased when a wider operation band-width or higher gain is required.

It has been demonstrated that, in an embodiment of the present invention, an antenna has been designed to operate over a frequency range from 470 MHz to 2200 MHz (i.e. tuning over 1730 MHz) with at least a 6 dB return loss across the operating band.

The balanced antenna system may be configured for Multiple-Input-Multiple-Output (MIMO) applications. Thus, the balanced antenna system may be incorporated into a system having multiple antennas. Each antenna may be balanced or unbalanced and may be configured to provide uncorrelated channels to increase the capacity of the system without the need for additional spectrum or transmitter power.

According to a second aspect of the present invention there is provided an antenna structure for MIMO applications comprising at least one balanced antenna system according to the first aspect of the invention and at least one further antenna.

The at least one further antenna may be constituted by a balanced or unbalanced antenna and may be reconfigurable. In one embodiment, the at least one further antenna may also be in accordance with the first aspect of the invention.

The relative positions of each antenna may be chosen so as to provide good (or optimal) antenna isolation. In some embodiments, this may be obtained by spacing each antenna from the other by the largest available distance. In practice, a first antenna may be located at a first end of the structure and a second antenna may be located at a second end of the structure.

In embodiments of the invention, the first and second antennas may be spaced by at least 200 mm, at least 150 mm, at least 100 mm or at least 50 mm.

In some embodiments, the balanced antenna system may be isolated from the further antenna by provision of a slot in a ground plane of the antenna structure.

Optional Features for the Further Antenna

In a particular embodiment, at least one further antenna may be constituted by a two-port chassis antenna of the type described in GB0918477.1. Thus, the further antenna may be a reconfigurable antenna comprising two or more mutually coupled radiating elements and two or more impedance-matching circuits configured for independent tuning of the frequency band of each radiating element, wherein each radiating element is arranged for selective operation in each of the following states: a driven state, a floating state and a ground state.

At least one of the radiating elements of the further antenna may be constituted by a non-resonant resonator. In a particular embodiment, two non-resonant resonators are employed. Each radiating element may be configured to operate over a wideband and/or a narrowband range of frequencies. In a particular embodiment, each impedance-matching circuit may comprise a wideband tuning circuit and a narrowband tuning circuit.

In one embodiment, the further antenna is provided on a substrate having a ground plane printed on a first side thereof. A first radiating element may be provided on the second side of the substrate, opposite to the first side, and laterally spaced from the ground plane. The first radiating element may be constituted by a metal patch, which may be planar or otherwise. In a specific embodiment, the first radiating element may be constituted by an L-shaped metal patch, having a planar portion and a portion orthogonal to the ground plane. The orthogonal portion may extend from an edge of the planar portion furthest from the ground plane such that the orthogonal portion is spaced from the ground plane by a so-called first gap.

A second radiating element may be constituted by a metal patch, which may be planar or otherwise. In a particular embodiment, the second radiating element is constituted by a planar metal patch, orthogonal to the ground plane. The second radiating element may be located between the ground plane and the orthogonal portion of the first radiating element (i.e. within the first gap). The distance between the ground plane and the second radiating element will form a so-called second gap. It will be understood that, in this embodiment, the distance between the second radiating element and the orthogonal portion of the first radiating element will determine the amount of mutual coupling therebetween. This distance will therefore be referred to throughout as the mutual gap.

The shape of each radiating element is not particularly limited and may be, for example, square, rectangular, triangular, circular, elliptical, annular, star-shaped or irregular. Furthermore, each radiating element may include at least one notch or cut-out. It will be understood that the shape and configuration of each radiating element will depend upon the desired characteristics of the further antenna for the applications in question.

Similarly, the size and shape of the ground plane may be varied to provide the optimum characteristics for all modes of the operation. Accordingly, the first ground plane may be, for example, square, rectangular, triangular, circular, elliptical, annular or irregular. Furthermore, the ground plane may include at least one notch or cut-out.

Each radiating element of the further antenna may have an associated feed port. Each feed port may be connected to a control module comprising a control means for selecting the operating state of the associated radiating element. The control means may comprise a switch selectively configured to allow the radiating element to float, to be connected to the ground plane or to be driven by its associated impedance-matching circuit.

In the above embodiment, a first feed port may be provided between the first radiating element and a first control module having a first impedance-matching circuit and a second feed port may be provided between the second radiating element and a second control module having a second impedance-matching circuit.

The first feed port may be positioned in the centre of the radiating element or off-centre (i.e. closer to one side of the radiating element than the other).

In a specific embodiment, the first feed port may be located approximately one third of the distance along the length of the first radiating element. This is advantageous in that it causes non-symmetrical current to be generated along the ground plane thereby supporting many different resonances. It also enables the first radiating element to generate more resonances due to it having a different electrical length in each direction. In addition, positioning the first feed port off-centre allows more space for the second radiating element to be positioned close to the first radiating element which, in turn, results in a better coupling between the two radiating elements.

The first feed port may be connected to the ground plane along an edge thereof. The first feed port may be connected at the centre of the edge or at or towards one side thereof. Having the first feed port connected at a side of the ground plane allows the second radiating element to make full use of the width of the ground plane. However, it also results in a different coupling efficiency between the radiating elements and the ground plane.

In certain embodiments, the second feed port is placed in close proximity to the first feed port. This enables each feed port to be operated independently (ON), or as a driver to the adjacent feed port (Ground), or to be electrically disconnected (OFF). Thus, it is possible to dynamically tune the operating frequency of each radiating element by selecting different modes of operation in relation to each radiating element. The table below provides some possible operating states based on selecting a combination of the above states for the first feed port (Feed Port 1) and the second feed port (Feed Port 2).

TABLE 1

Possible operating states of the further antenna

| State | Mode 1       | Feed Port 1 | Mode 2       | Feed Port 2 |
|-------|--------------|-------------|--------------|-------------|
| 1     | Feed antenna | ON          | Parasitic    | Ground      |
| 2     | Parasitic    | Ground      | Feed antenna | ON          |
| 3     | Feed antenna | ON          | Floating     | OFF         |
| 4     | Floating     | OFF         | Feed antenna | ON          |
| 5     | Feed antenna | ON          | Feed antenna | ON          |

It will be understood that Mode 1 and Mode 2 represent the operating modes of the first radiating element and the second radiating element, respectively. Accordingly, when a feed port is ON the associated radiating element serves as a driven (or feed) antenna resonating at the frequencies supported by the corresponding impedance-matching circuit. When the feed port is OFF (i.e. electrically disconnected) the associated radiating element is permitted to float (i.e. to resonate at any supported frequency). When the feed port is at Ground the associated radiating element serves as a parasitic element (i.e. resonating at a particular frequency, effectively preventing the other radiating element from supporting that frequency). It will therefore be appreciated that embodiments of the present invention enable a diverse set of operating modes allowing increased tunability over conventional antenna designs.

In an embodiment of the present invention, the first radiating element of the further antenna may have a tuning range of approximately 0.4 to 3 GHz and the second radiating element of the further antenna may have a tuning range of approximately 1.6 to 3 GHz (or higher).

A single tuning capacitor may be employed to tune each radiating element of the further antenna in each operating mode. The single tuning capacitor may be constituted by a varactor diode.

In certain embodiments three or more radiating elements may be employed to further increase the frequency tuning agility of the further antenna. A third or subsequent radiating element may be located within the first gap defined above. The third or subsequent radiating elements may be configured to operate at frequencies greater than 3 GHz.

It will be understood that a merit of employing a further antenna as described above is that it enables those knowledgeable in the art to easily configure the antenna to a multitude of operating frequencies. Furthermore, various impedance-matching circuit configurations can be easily implemented to enable the further antenna to operate in both a listening and an application mode. Thus, the further antenna design described above can provide a wide frequency tuning range or wideband performance. However, it cannot provide MIMO performance on its own as there is a strong coupling between the two ports when they are at the same frequency. Even at relatively low frequencies (e.g. 700 MHz), simulation results have shown that the coupling is approximately zero, however, it noted that for a product suitable for mobile phone applications, a coupling of at least −15 dB is preferred.

It is therefore desirable to combine the further antenna with the balanced antenna system of the first aspect of the invention in order to provide at least two uncoupled reconfigurable antennas suitable for MIMO applications. Simulations have shown that at least −30.53 dB of isolation can be achieved with embodiments of the second aspect of the invention, thus making such a structure ideal for MIMO devices. The results also suggest that the antenna structure can provide a wide tuneable range (i.e. from 470 MHz to 2200 MHz) and has potential for use in a mobile device to cover DVB-H, GSM710, GSM850, GSM900, GPS1575, GSM1800, PCS1900, and UMTS2100. The proposed antenna structure is therefore an ideal candidate for MIMO applications, especially in small terminal mobile devices such as phones, laptops and PDAs.

It will be understood that a parametric study may be undertaken to evaluate the optimum construction of a particular antenna structure according to an embodiment of the present invention.

BRIEF DESCRIPTION OF THE DRAWINGS

Certain embodiments of the present invention will now be described with reference to the accompanying drawings in which:

FIG. 1A shows a front view of a balanced antenna according to a first embodiment of the present invention;

FIG. 1B shows a rear view of the balanced antenna of FIG. 1A;

FIG. 2 shows a circuit diagram for a balun configuration for use with the balanced antenna shown in FIGS. 1A and 1B;

FIG. 3 shows a schematic representation of a balanced antenna system according to an embodiment of the present invention;

FIG. 4 shows a circuit diagram for an impedance-matching circuit configuration for an embodiment of the present invention;

FIG. 9A shows a front view of a combined MIMO antenna system comprising the balanced antenna of FIGS. 1A and 1B with a chassis antenna;

FIG. 9B shows a rear view of the combined MIMO antenna system of FIG. 9A;

FIG. 10 shows a graph of S parameters for the MIMO antenna system of FIGS. 9A and 9B when connected to the circuit shown in FIGS. 5A and 5B;

DETAILED DESCRIPTION OF CERTAIN EMBODIMENTS

Figure 5A:
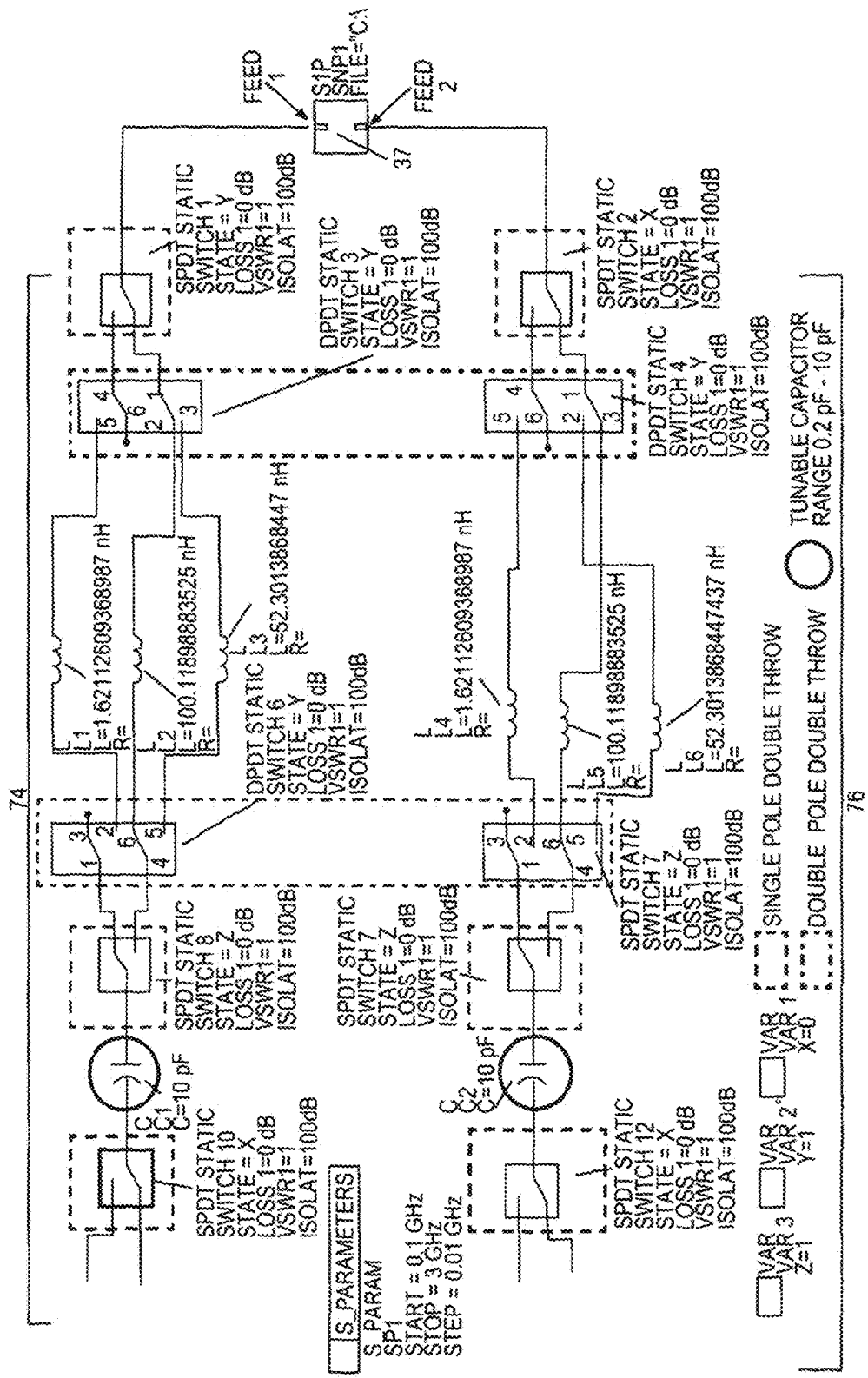
FIGS. 5A and 5B show a circuit diagram for a balanced antenna system according to an embodiment of the present invention, including multiple balun configurations and multiple impedance-matching configurations.

With reference to FIGS. 1A and 1B, there is illustrated a balanced antenna system 10 according to a first embodiment of the present invention. The balanced antenna system 10 is reconfigurable, as will be described in more detail below, and is designed for use in a portable product such as a mobile phone, laptop or PDA.

The balanced antenna system 10 is provided on a microwave substrate 12 (e.g. a printed circuit board, PCB) having a surface area of approximately 116×40 mm² and a thickness of approximately 1.15 mm so that the system can easily be accommodated in a conventional mobile phone.

As illustrated in FIG. 1A, a first radiating element 14 is provided on a first side 16 of the substrate 12, at a first end portion 18 thereof. The first radiating element 14 is formed from a substantially U-shaped first strip layer 20 which is located in one half of the first end portion 18 of the substrate 12 and is orientated such that its open end 22 faces inwardly towards the central region of the first end portion 18. A short feed line 24 is provided at a start of the first strip 20 closest to the centre of the substrate 12 and extends along the length of the substrate 12.

A second radiating element 26, which is substantially similar to the first radiating element 14, is also provided on the first side 16 of the substrate 12 and is located in an adjacent half of the first end portion 18 of the substrate 12. The second radiating element 26 is therefore formed from a substantially U-shaped second strip layer 28 which is also orientated such that its open end 30 faces inwardly towards the central region of the first end portion 18. Thus, the second radiating element 26 is orientated in an opposite direction to the first radiating element 14. A short feed tine 32 is again provided at a start of the second strip 28 closest to the centre of the substrate 12 and extends along the length of the substrate 12.

A gap 34 is provided between the respective feed lines 24, 32 of the first and second radiating elements 14, 26 and between the respective ends 36 of the first and second strips 20, 28. Accordingly, the first and second radiating elements 14, 26 form a dipole antenna 37. In the embodiment shown in FIG. 1A, the first and second radiating elements 14, 26 together extend over an area of approximately 40×10 mm².

As shown in FIG. 1B, a ground plane 38 is provided on a second side 40 of the substrate 12, opposite to the first side 16. The ground plane 38 is substantially rectangular and occupies substantially the whole of the substrate 12 surface from a second end 42 thereof (opposite to the first end portion 18) to a position substantially opposite the feed lines 24, 32. The ground plane 38 has a size of approximately 100×40 mm$^2$.

The balanced antenna system 10 also includes a balun and two matching circuits which are connected to the first and second radiating elements 14, 26 and which are not shown in FIGS. 1A and 1B for reasons of clarity but which would be provided on the first side 16 of the substrate 12, opposite to the ground plane 40.

An example of a suitable balun 50 is shown in FIG. 2 by way of an LC circuit diagram. This particular balun 50 has a wideband configuration and is substantially as described by Iizuka and Watanabe in published Japanese patent application number 2005-198167. Thus, the balun 50 comprises a first (unbalanced) port $Z_u$ forming an input to a T-junction 52 which is configured to split an electrical signal received at the first port $Z_u$ into a high path 54 and a low path 56. The high path 54 is arranged to feed into a first high pass filter (HPF) and the low path is arranged to feed into a second low pass filter (LPF).

The high pass filter (HPF) is constructed from an L-C circuit having three capacitors connected in series $C_{H1}$, $C_{H2}$, $C_{H1}$ and two inductors $L_{H1}$, $L_{H1}$ connected in parallel from respective branches provided between the capacitors. Each of the inductors $L_{H1}$ is connected to the ground plane 40 and the output from the capacitors $C_{H1}$, $C_{H2}$, $C_{H1}$ constitutes an impedance $Z_{bH}$.

The low pass filter (LPF) is constructed from an L-C circuit having three inductors connected in series $L_{L1}$, $L_{L2}$, $L_{L1}$ and two capacitors $C_{L1}$, $C_{L1}$ connected in parallel from respective branches provided between the inductors. Each of the capacitors $C_{L1}$ is connected to the ground plane 40 and the output from the inductors $L_{L1}$, $L_{L2}$, $L_{L1}$ constitutes an impedance $Z_{bL}$. Together, $Z_{bH}$ and $Z_{bL}$ form a balanced output $Z_b$.

As illustrated in FIG. 3, the balanced antenna system 10 according to the present embodiment of the invention comprises the balun 50 shown in FIG. 2, used to feed the balanced dipole antenna 37 shown in FIG. 1A, with an impedance matching circuit 60 provided therebetween. It will be noted that in this illustration, an input Port 1 is shown which feeds into the first (unbalanced) port $Z_u$ of the balun 50 to drive the balanced antenna system 10. More specifically, the high pass filter with impedance $Z_{bH}$ from the balun 50 is connected to the matching circuit 60 and to Feed 1 (i.e. feed line 24 of FIG. 1A) of the dipole antenna 37 and the low pass filter with impedance $Z_{bL}$ from the balun 50 is connected to the matching circuit 60 and to Feed 2 (i.e. feed line 32 of FIG. 1A) of the dipole antenna 37.

As will be explained in more detail below, by incorporating the matching circuit 60 between the dipole antenna 37 and the balun 50, the system can be made reconfigurable and can be used to provide a wide tuning range of from 470 MHz to 2200 MHz, which can cover DVB-H, all GSM and UMTS2100 frequency bands.

FIG. 4 shows a circuit diagram for a particular impedance-matching circuit 60 which can be used in an embodiment of the present invention. It will be noted that in this illustration, the paths for the high pass filter with impedance $Z_{bH}$ and the low pass filter with impedance $Z_{bL}$ from the balun 50 to Feed 1 and Feed 2 respectively, have been separated out such that the impedance-matching circuit 60 is split into a first matching circuit 62 and a second matching circuit 64. In this particular embodiment, the first and second matching circuits 62, 64 are identical and are configured to provide impedance transformation to each leg of the balanced dipole antenna 37.

More specifically, each of the first and second matching circuits 62, 64 comprise an inductor $L_2$ connected in parallel to the ground plane 40 and a capacitor $C_1/C_2$ and inductor $L_1$ connected in series. The capacitors $C_1/C_2$ are variable so as to allow the impedance of the first and second matching circuits 62, 64 to be adjusted to tune the antenna 37 over a range of frequencies.

Figure 5B:
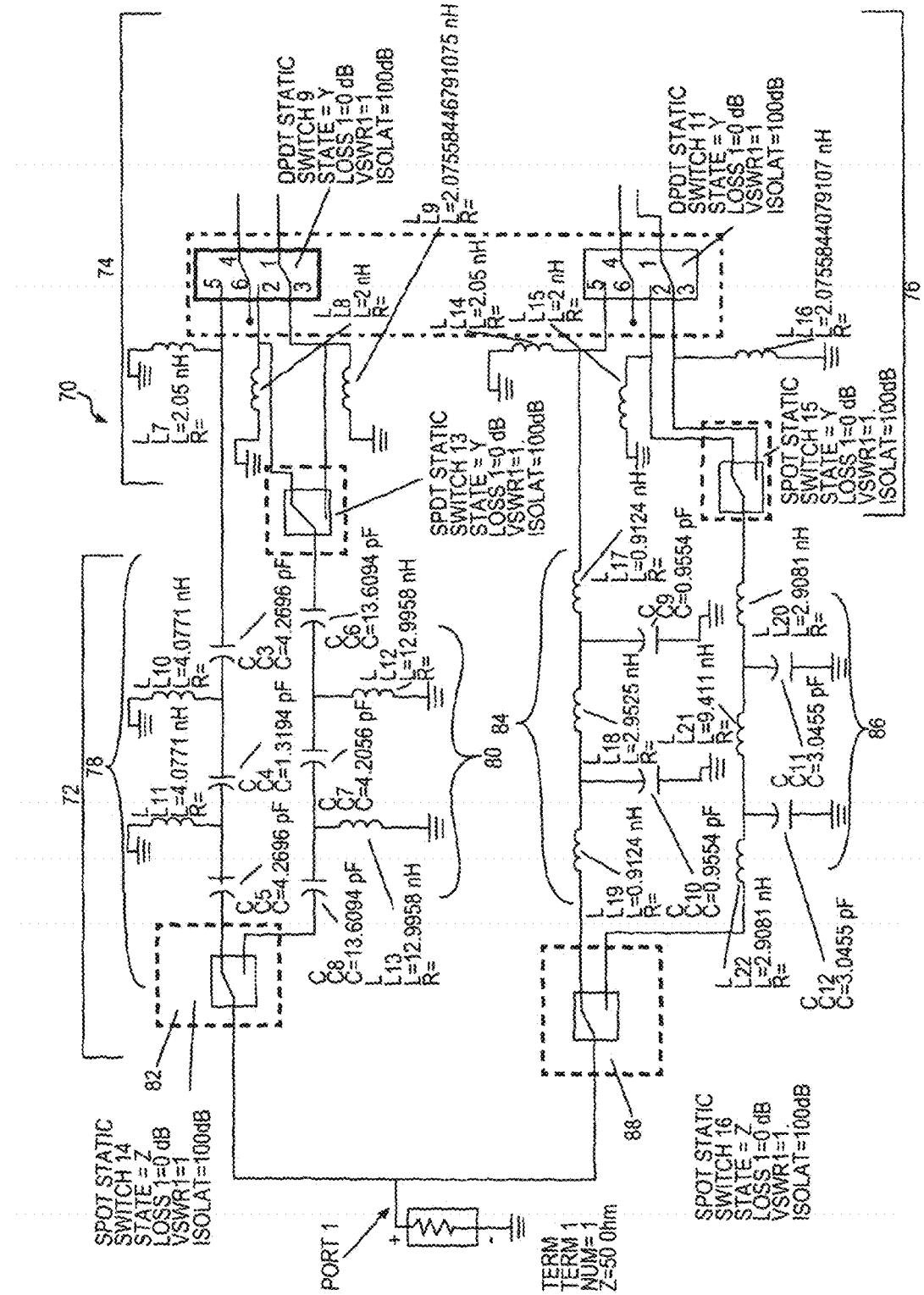

While the embodiment shown in FIG. 4 can enable tuning over a certain range of frequencies it has been discovered that a greater tuning range can be achieved by including multiple balun configurations and multiple impedance-matching configurations into an integrated tuning circuit 70, such as illustrated in FIGS. 5A and 5B. In this embodiment, input Port 1 (unbalanced feed-line) is provided at the left-hand side of the circuit 70 and the unbalanced feed-line is converted to two balanced feed-lines via the balun configuration 72. The high pass filter is connected to a first impedance matching circuit 74 and to the balanced dipole antenna 37 via Feed 1, and the low pass filter is connected to a second impedance matching circuit 76 and to the balanced dipole antenna 37 via Feed 2.

The balun configuration 72 comprises a first high pass filter 78 and a second high pass filter 80 which are identical in construction to the high pass filter described above in relation to FIG. 2 but which have different values for each of the capacitors and inductors. A first (signal pole double throw) switch 82 is provided to select one of the first or second high pass filters 78, 80 to be employed at any one time. A first low pass filter 84 and a second low pass filter 86 are also provided which are identical in construction to the low pass filter described above in relation to FIG. 2 but which again have different values for each of the capacitors and inductors. A second (signal pole double throw) switch 88 is provided to select one of the first or second low pass filters 84, 86 to be employed at any one time.

The first impedance matching circuit 74 is of the form described above in relation to FIG. 4 but includes three different inductors (L7, L8, L9) which can be selected as the inductor in parallel ($L_2$) and three further different inductors (L1, L2, L3) which can be selected as the inductor in series ($L_1$). Various switches are provided in order to activate the desired combination of components for the first impedance matching circuit 74. As above, a tunable capacitor $C_1$ (i.e. varactor) is provided between the two sets of inductors. The tunable capacitor $C_1$ can be tuned from 0.2 pF to 10 pF.

Similarly, the second impedance matching circuit 76 is of the form described above in relation to FIG. 4 but also includes three different inductors (L14, L15, L16) which can be selected as the inductor in parallel ($L_2$) and three further different inductors (L4, L5, L6) which can be selected as the inductor in series ($L_1$). Various switches are provided in order to activate the desired combination of components for the second impedance matching circuit 76. As before, a tunable capacitor $C_2$ (i.e. varactor) is provided between the two sets of inductors. The tunable capacitor $C_2$ can be tuned from 0.2 pF to 10 pF.

The circuit shown in FIGS. 5A and 5B was designed using a simulation tool (CST Microwave Studio®) in which the antenna structure of FIGS. 1A and 1B was simulated using the transient solver to produce a 1-Port S-Parameter file representing the antenna response and this was used as a starting point for designing the matching networks. The values of the components within the first and second matching circuits 74, 76 were calculated using standard formulas available within the literature. Microwave Office (an RF/microwave design platform available from AWR Corporation) was then used to adjust the value of each inductor in order to optimize the return loss performance of the antenna. The capacitors $C_1$ and $C_2$ were fixed to 10 pF respectively during this phase of the design process. It is noted that the same simulation tool was used for all simulations described herein.

The Applicants discovered during these simulations that, in order to obtain a single resonance across the whole of the desired operating band (470 MHz to 2200 MHz), with at least 6 dB return loss, three different configurations for each of the matching networks 74, 76 were required along with the two different configurations for the balun 72. These different configurations have been integrated into the circuit shown in FIGS. 5A and 5B but could be provided as three separate circuits if desired.

Table 2 below lists the required logic states for the switches shown in FIG. 5 in order to produce the required spectrum coverage. In this embodiment, a single pole double throw switch, such as switch 82 in FIGS. 5A and 5B, is in an 'on' position, represented by '1' and an 'off' position, represented by '0'. For a double pole double throw switch as illustrated in FIGS. 5A and 5B, a '0' represents the situation where nodes labelled 1 and 2 are connected and nodes labelled 4 and 5 are connected while a '1' represents the situation where nodes labelled 1 and 3 are connected and nodes labelled 4 and 6 are respectively connected. As illustrated in FIG. 5, each of the switches is shown in a default position.

TABLE 2

Operating logic states

| Modes | X | Y | Z | Operating band OUTPUT (MHz) |
|---|---|---|---|---|
| A | 1 | 1 | 0 | 470-640 |
| B | 1 | 0 | 0 | 630-1520 |
| C | 0 | 0 | 1 | 1500-2200 |

Thus, the three states described in Table 2 and denoted as Mode A, B, and C relate to the three relatively narrow bands of operation of the antenna.

Figure 6:
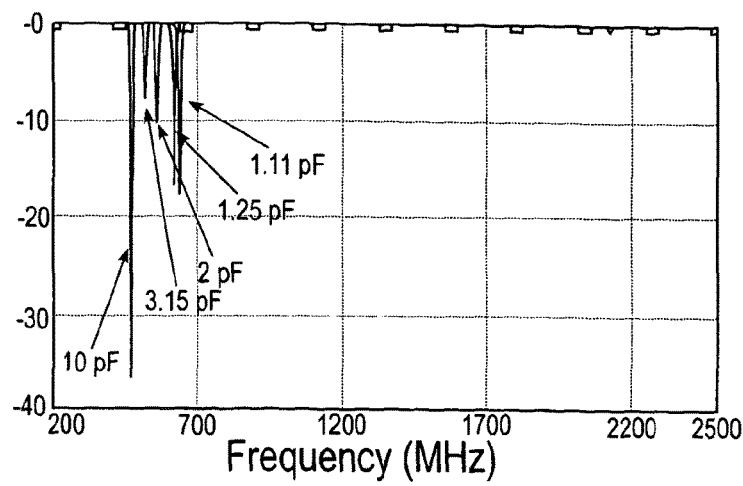
FIG. 6 shows a graph of return loss against frequency for a first configuration of the circuit shown in FIGS. 5A and 5B, over a range of varactor capacitance from 1.11 pF to 10 pF.

In Mode A operation, it is possible to move the resonant frequency from 470 MHz to 640 MHz by varying the varactors $C_1$ and $C_2$ together from 10 pF to 1.11 pF as illustrated in FIG. 6.

Figure 7:
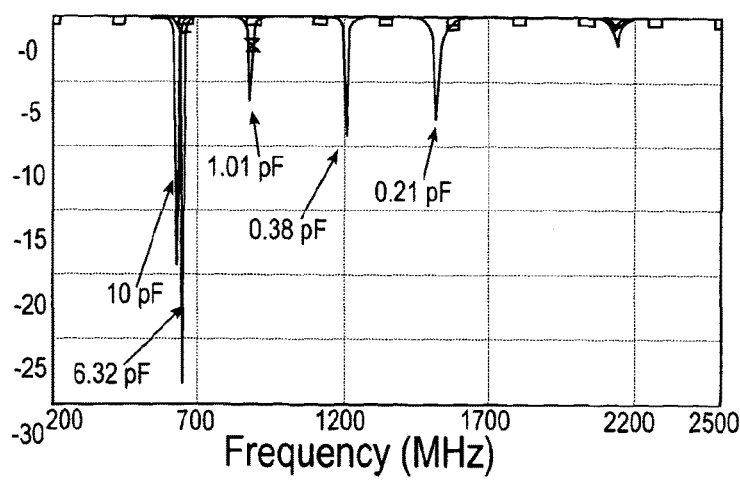
FIG. 7 shows a graph of return loss against frequency for a second configuration of the circuit shown in FIGS. 5A and 5B, over a range of varactor capacitance from 0.21 pF to 10 pF.

FIG. 7 illustrates Mode B operation in which the resonant frequency can be tuned from 630 MHz to 1520 MHz by varying the varactors $C_1$ and $C_2$ together from 10 pF to 0.21 pF.

Figure 8:
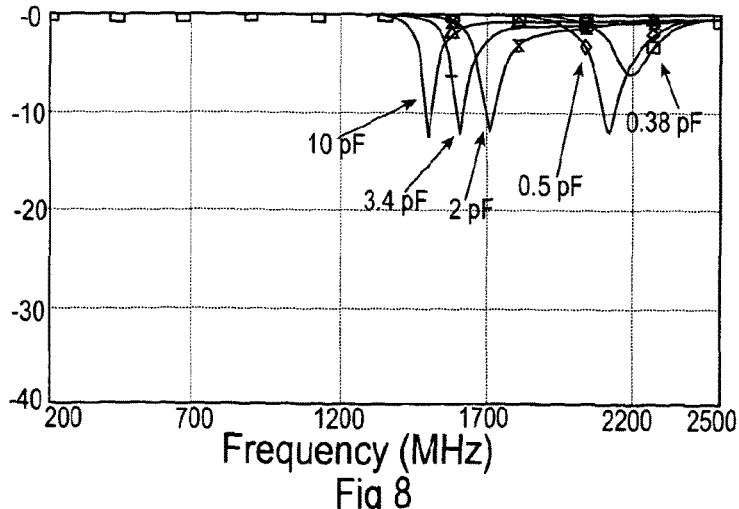
FIG. 8 shows a graph of return loss against frequency for a third configuration of the circuit shown in FIGS. 5A and 5B, over a range of varactor capacitance from 0.38 pF to 10 pF.

Similarly, FIG. 8 illustrates Mode C operation when the varactors $C_1$ and $C_2$ together are varied from 10 pF to 0.38 pF and the resonant frequency is moved from 1500 MHz to 2200 MHz.

Thus, the simulation results using ideal components show that the present antenna structure has wide tuning range of 1730 MHz. Accordingly, the resonant frequency of the antenna can be tuned to cover DVB-H, GSM710, GSM850, GSM900, GPS1575, GSM1800, PCS 1900 and UMTS2100 bands.

It will be noted that although the varactors $C_1$ and $C_2$ have each been varied together in the above examples, in other embodiments, tuning may achieved by setting each varactor to a different value.

An antenna structure 90 suitable for Multiple-Input-Multiple-Output (MIMO) applications is illustrated in FIGS. 9A and 9B in accordance with another embodiment of the present invention. The antenna structure 90 comprises the balanced antenna system 10 described above in combination with a two-port chassis antenna 100. As explained above MIMO devices utilise multiple uncorrelated channels/antennas to increase the capacity of a communication link without the need of additional spectrum or transmitter power. The uncorrelated antennas should be terminated at an optimal location to induce a required (or best) antenna-to-antenna isolation. The best isolation values are often achieved when the antennas are spaced by the largest available distance (e.g. one at the top edge of the substrate 12 and the other at the bottom edge). In this particular embodiment, the antennas are separated along the length of the substrate 12 by a distance of approximately 100 mm.

In the present application, many examples of MIMO systems according to the present invention are described. For the first three cases, it will be noted that the MIMO system comprises two separate antennas. While in the forth case, the MIMO system comprises three separate antennas.

In the MIMO system shown in FIGS. 9A and 9B, the two-port chassis antenna 100 is of the type described in detail in GB0918477.1 and comprises a pair of non-resonant coupling elements 112, 114, that are capable of simultaneous dual-band operation. The coupling elements 112, 114 occupy a relatively small volumetric space of 40×5×7 mm$^3$ and are located on the top of a chassis 116 on the same side as the second side 40 of the substrate 12, while the dipole antenna 37 of the balanced antenna system 10 is located on the opposite first side 16.

More specifically, the two coupling elements 112, 114 are mounted in close proximity to each other and are driven over the ground plane 38. The first coupling element 112 is constituted by an L-shaped metal patch having a planar portion which constitutes the chassis 116, parallel to the ground plane 38, and an orthogonal portion 118, orthogonal to the ground plane 38. As described above, the planar portion 116 is provided on the opposite side of the substrate from the ground plane 38 and is laterally spaced therefrom. The orthogonal portion 118 extends from an edge of the planar portion 116 furthest from the ground plane 38 such that the orthogonal portion 118 is spaced from the ground plane 38 by a so-called first gap 120. In this particular embodiment the first gap 120 is less that 10 mm.

The second coupling element 114 is also constituted by a metal patch which, in this case, forms a planar rectangle. The second radiating element 114 is also orientated orthogonally to the ground plane 38 and is located within the first gap 120. Thus, the second radiating element 114 is effectively enclosed on two adjacent sides by the L-shaped first coupling element 12. In the embodiment shown, the second coupling element 114 is approximately half the length of the first coupling element 112 and is slightly inset from the edge of the first coupling element 112. The distance between the ground plane 38 and the second coupling element 114 forms a so-called second gap 122. The distance between the second coupling element 114 and the orthogonal portion 118 of the first coupling element 12 determines the amount of mutual coupling therebetween. This distance is therefore referred to as the mutual gap 124.

Although not shown, each radiating element 112, 114 is connected, respectively, to a first and second control module via a second and third feed port 126, 128. The second feed port 126 (Port 2) extends between the orthogonal portion 118 of the first coupling element 112 and a first control module (not shown), and is located approximately one third of the distance along the length of the first coupling element 112. The third feed port 128 (Port 3) is located adjacent to the second feed port 126 and connects to an adjacent second control module (not shown). As described in GB0918477.1 each coupling element 112, 114 can be selectively driven independently, allowed to float, or tied to the ground state through operation of the respective control modules. Thus, it is possible to dynamically tune the operating frequency of each coupling element 112, 114 by selecting different modes of operation in a similar manner to that described above in relation to the tuning of the balanced dipole antenna 37.

It is possible to operate the MIMO antenna structure 90 by driving the balanced antenna system 10 through Port 1 and using Port 2 and Port 3 to operate each of the coupling elements 112, 114 of the chassis antenna 100. For purposes of demonstration, Port 1 was connected to a circuit similar to that shown in FIGS. 5A and 5B and only Port 2 was activated in connection with the chassis antenna 100. More specifically, Port 2 was connected to a circuit of the type described in GB0918477.1 and Port 3 was simply connected to a 50 ohm load but could have been tuned separately.

FIG. 10 shows a graph of S parameters for the MIMO antenna structure of FIGS. 9A and 9B under the circumstances described above. Thus, the return loss for the balanced antenna system 10 was found to be approximately −11.62 dB while the return loss for Port 2 of the chassis antenna 100 was approximately −35.92dB. It is also apparent from FIG. 10 that the S21 return loss (which is a measure of the isolation between the balanced antenna 10 and the chassis antenna 100) is approximately −30.53 dB.

Figure 11A:
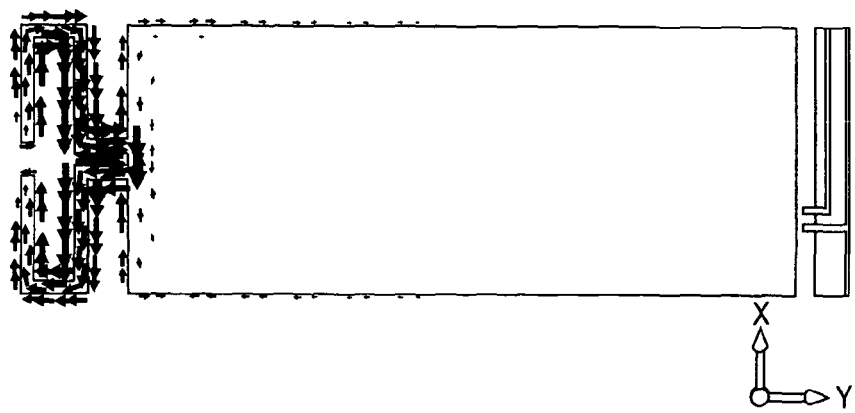
FIG. 11A illustrates the current distribution through the MIMO antenna system of FIGS. 9A and 9B when the balanced antenna is driven.
Figure 11B:
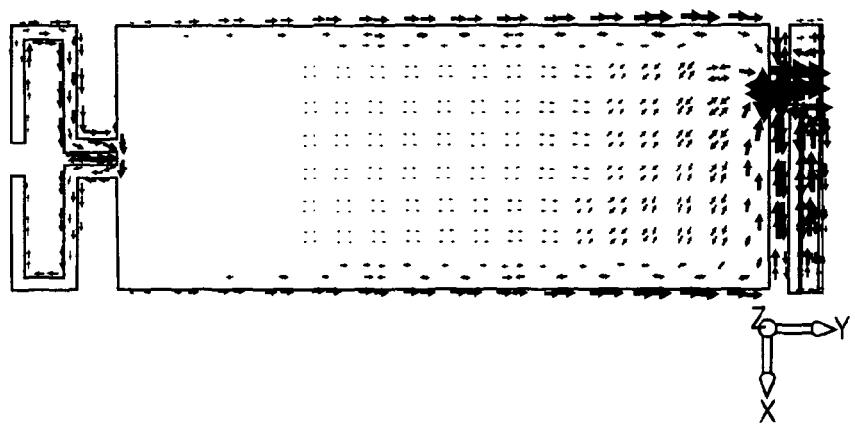
FIG. 11B illustrates the current distribution through the MIMO antenna system of FIGS. 9A and 9B when the chassis antenna is driven.

The low isolation between the balanced antenna 10 and the chassis antenna 100 can be explained from the current distribution plots of FIGS. 11A and 11B, which are taken when either the balanced antenna 10 is driven (FIG. 11A) or the chassis antenna 100 is driven (FIG. 11B). Thus, it can be seen that in each case the current is very much concentrated around the antenna being driven, with little or no current flowing in the other antenna.

Figure 12A:
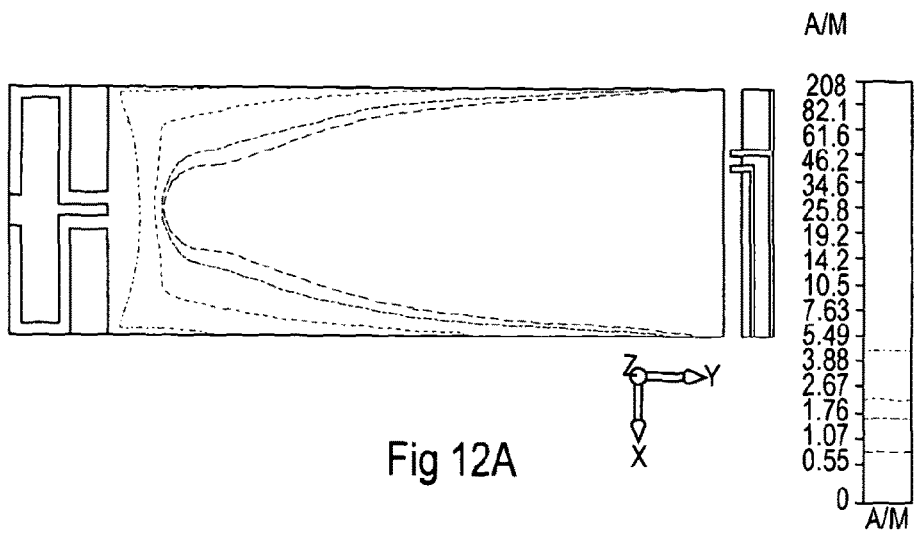
FIG. 12A illustrates the average current distribution through the MIMO antenna system of FIGS. 9A and 9B when the balanced antenna is driven.
Figure 12B:
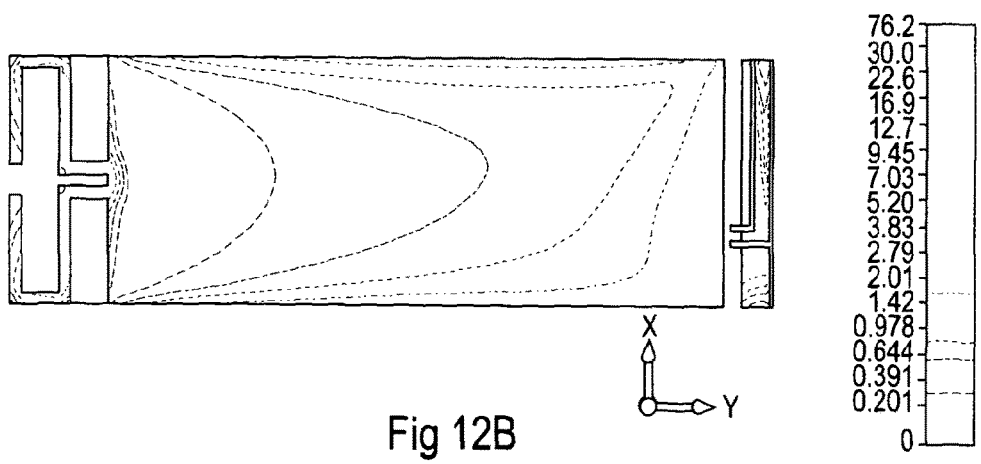
FIG. 12B illustrates the average current distribution through the MIMO antenna system of FIGS. 9A and 9B when the chassis antenna is driven.

FIGS. 12A and 12B also corroborate this result through an illustration of the average current distribution when either the balanced antenna 10 is driven or the chassis antenna 100 is driven.

Figure 13A:
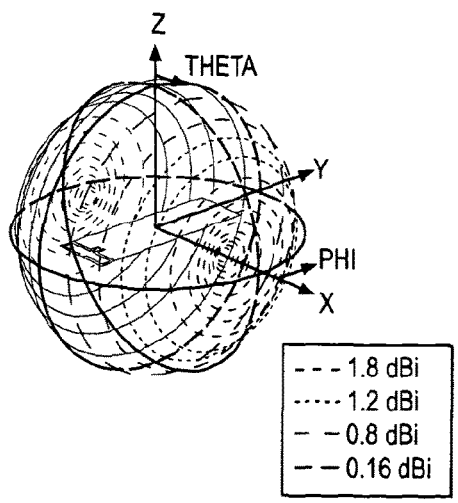
FIG. 13A illustrates the far field current distribution of the MIMO antenna system of FIGS. 9A and 9B when the balanced antenna is driven at 700 MHz.
Figure 13B:
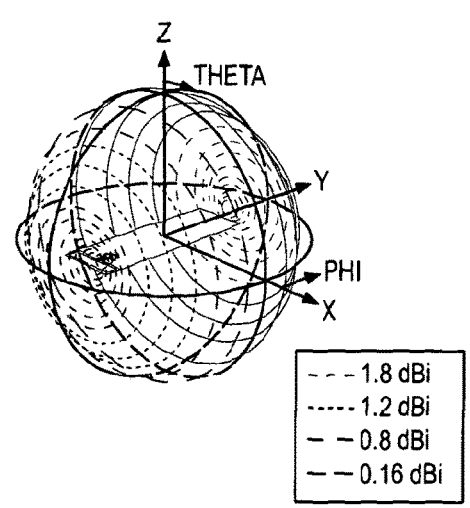
FIG. 13B illustrates the far field current distribution of the MIMO antenna system of FIGS. 9A and 9B when the chassis antenna is driven at 700 MHz.

As illustrated in FIGS. 13A and 13B, the directivity of the current distribution for the MIMO antenna system is different when the balanced antenna is driven (FIG. 13A) and when the chassis antenna is driven (FIG. 13B). This therefore explains why the coupling is low between the two antennas.

It is noted that the present simulations are calculated using ideal components. In practice, integrating the matching circuit of FIGS. 5A and 5B with the antenna structure 90 will have an effect on the efficiency and gain of the antenna structure. This effect has been calculated such that, after the antenna structure 90 has been connected to the matching circuit, the balanced antenna has a total efficiency of −1.038 dB and a Realized Gain of 0.7664 dB while the chassis-antenna has a total efficiency of−5.06 dB and a Realized Gain of −3.072 dB. These results therefore reflect the addition loss of the matching circuit.

Figure 14A:
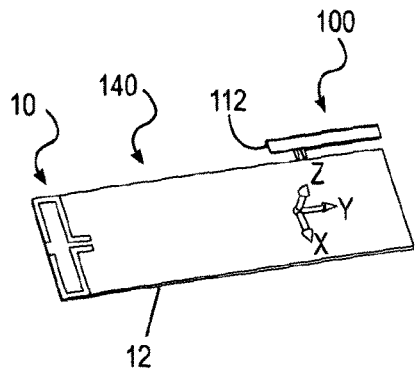
FIG. 14A shows a front view of another combined MIMO antenna system comprising the balanced antenna of FIGS. 1A and 1B with a side-mounted chassis antenna.
Figure 14B:
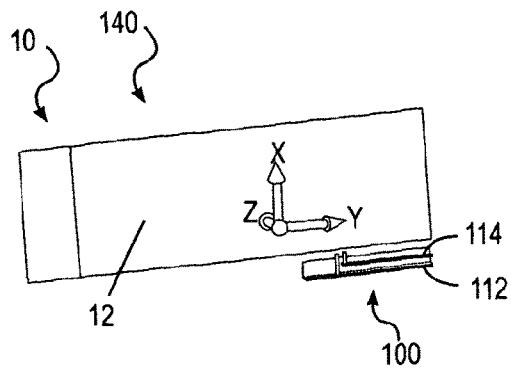
FIG. 14B shows a rear view of the combined MIMO antenna system shown in FIG. 14A.

FIGS. 14A and 14B show, respectively, a front view and a rear view of another combined MIMO antenna system 140 comprising the balanced antenna 10 of FIGS. 1A and 1B and the chassis antenna 100 of FIGS. 9A and 9B but, in this case, the chassis antenna 100 is mounted on the side rather than the end of the substrate 12. The chassis antenna 100 is still mounted towards the opposite end of the substrate 12 (and on the opposite side of the substrate) when compared to the balanced antenna 10, so as to provide the largest possible separation between the two antennas in this configuration. As illustrated, the antennas are separated along the length of the substrate 12 by a distance of approximately 60 mm.

As above, Port 1 was connected to the balanced antenna 10 and driven by the circuit of FIGS. 5A and 5B, Port 2 was connected to the large coupling element 112 (driven by a matching circuit of the type described in GB0918477.1) and Port 3 was connected to the small coupling element 114 and was simply tied to a 50 ohm load.

Figure 15:
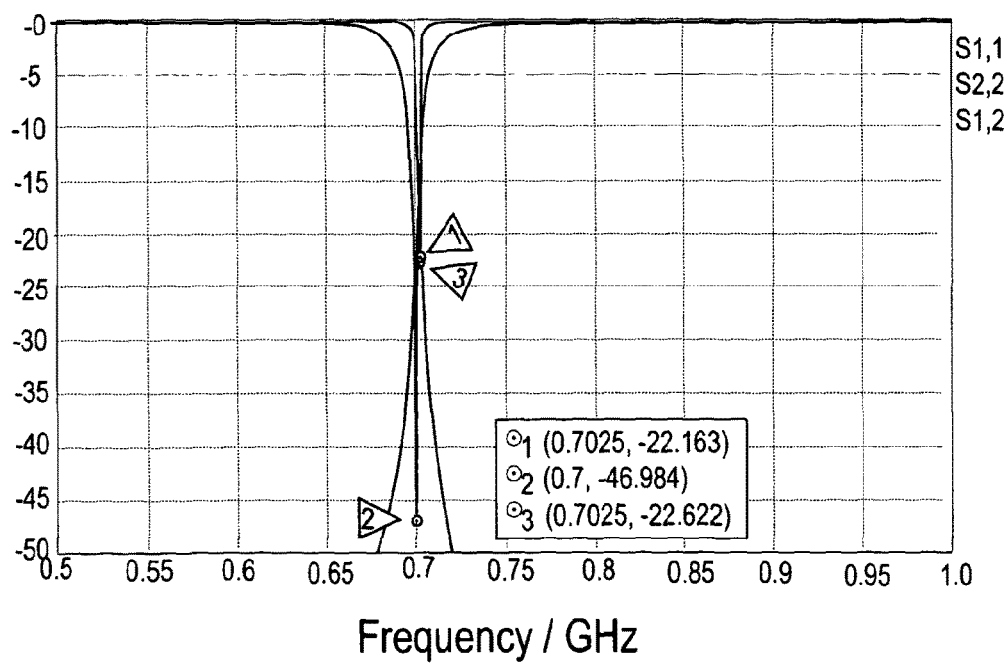
FIG. 15 shows a graph of S parameters for the MIMO antenna system of FIGS. 14A and 14B when connected to the circuit shown in FIGS. 5A and 5B.

FIG. 15 illustrates that the return loss for the balanced antenna 10, incorporating a matching network of FIGS. 5A and 5B, is about −22.16 dB while the return loss for the chassis antenna 100 is about −46.98 dB. It is also clear from FIG. 15 that the S12 isolation between the balanced antenna 10 and the chassis-antenna 100 is about −22.62 dB.

Figure 16A:
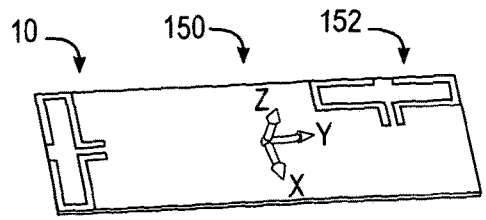
FIG. 16A shows a front view of another combined MIMO antenna system comprising the balanced antenna of FIGS. 1A and 1B with a second, side-mounted balanced antenna.
Figure 16B:
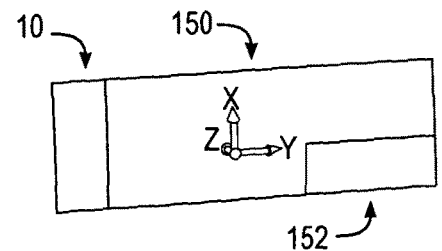
FIG. 16B shows a rear view of the combined MIMO antenna system shown in FIG. 16A.

FIGS. 16A and 16B show, respectively, a front view and a rear view of another combined MIMO antenna system 150 comprising the balanced antenna 10 of FIGS. 1A and 1B plus a second balanced antenna 152 (which is identical to that of FIGS. 1A and 1B) and which is mounted towards the opposite end of the substrate 12 (and on the same side of the substrate 12) when compared to the balanced antenna 10, but is orientated orthogonally to the balanced antenna 10 is located along the top edge as viewed. As illustrated, the antennas are separated along the length of the substrate 12 by a distance of approximately 60 mm.

In this embodiment, Port 1 is connected as described above and Port 2 is connected to the second balanced antenna 152 and to a further optimized circuit similar to that shown in FIGS. 5A and 5B.

Figure 17:
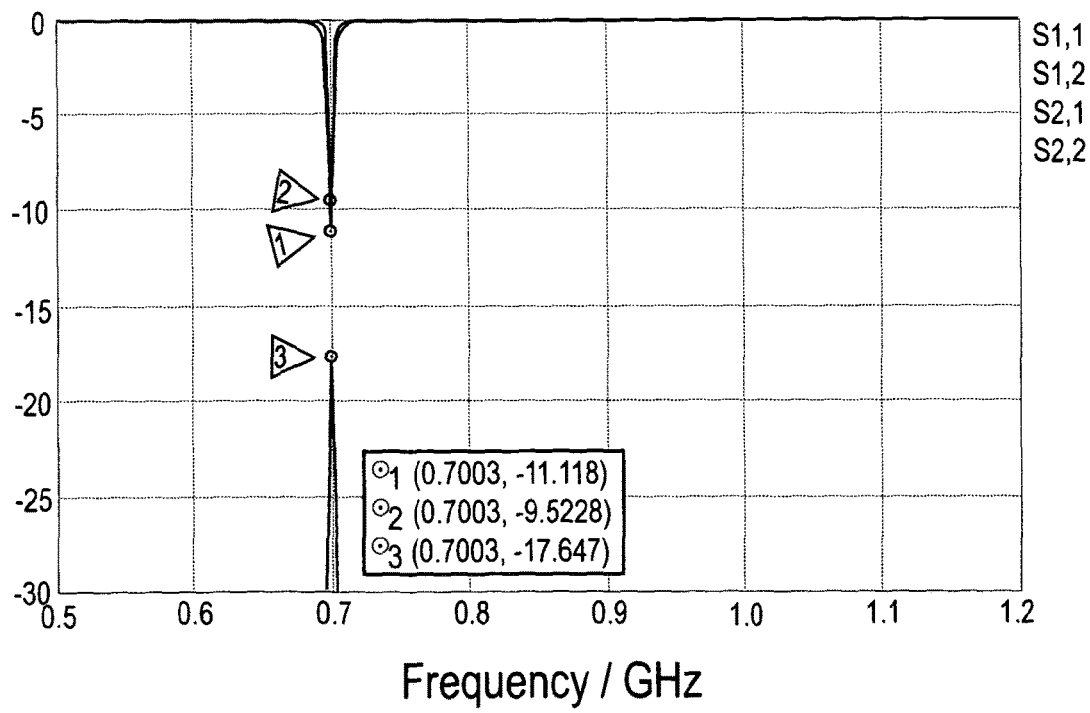
FIG. 17 shows a graph of S parameters for the MIMO antenna system of FIGS. 16A and 16B when connected to the circuit shown in FIGS. 5A and 5B.

FIG. 17 illustrates the S parameters for the MIMO antenna system 150 when each of the antennas are connected to the respective matching networks. The return loss for the balanced antenna 10 is about −11.12 dB while the return loss for the second balanced antenna 152 is about −9.52 dB. It can also be seen that the S12 isolation between the two balanced antennas is about −17.65 dB in this embodiment.

Figure 18A:
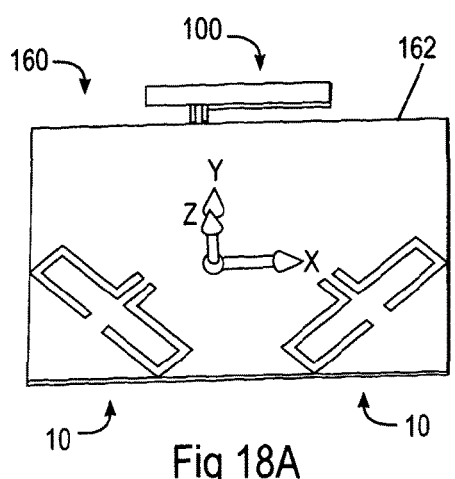
FIG. 18A shows a front view of another combined MIMO antenna system comprising two balanced antennas with a side-mounted chassis antenna.
Figure 18B:
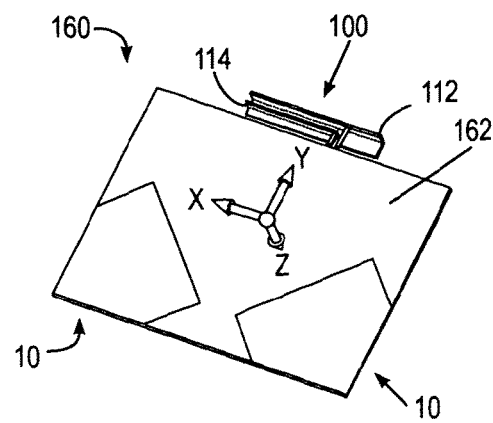
FIG. 18B shows a rear view of the combined MIMO antenna system shown in FIG. 18A.

FIGS. 18A and 18B show, respectively, a front view and a rear view of another combined MIMO antenna system 160 comprising two balanced antennas 10 (which are identical to those described in relation to FIGS. 1A and 1B) plus the chassis antenna 100 described in relation to FIGS. 9A and 9B. However, in this particular embodiment the substrate 162 has an area of approximately 90×66 mm$^2$, the chassis antenna 100 is mounted in the middle of the long side of the substrate 162, and the two balanced antennas 10 are mounted towards each of the two corners of the substrate 162 furthest from the chassis antenna 100. The two balanced antennas 10 are also orientated at an inwardly inclined angle of approximately 45° with respect to the length of the substrate 162. The two balanced antennas 10 are each separated from the chassis antenna 100 in a direction along the short dimension of the substrate 162 by about 30.64 mm and are separated from each other along the long dimension of the substrate 162 by about 19.29 mm.

In this embodiment, Port 1 and Port 2 are connected to each of the balanced antennas 10 and their respective matching circuits and Port 3 is connected to the large coupling element 112 of the chassis antenna 100 (and its optimized matching circuit). The small coupling element 114 is left as an open circuit in this embodiment.

Figure 19:
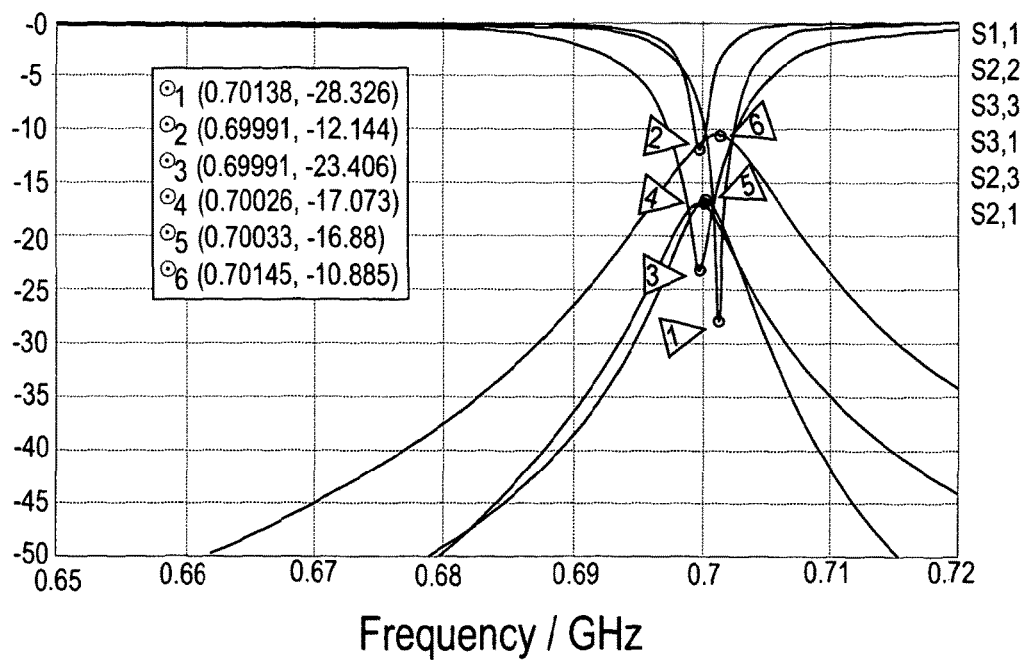
FIG. 19 shows a graph of S parameters for the MIMO antenna system of FIGS. 18A and 18B when connected to the circuit shown in FIGS. 5A and 5B.

FIG. 19 illustrates that the return loss for the first of the balanced antennas 10, incorporating the matching network, is about −28.32 dB while the return loss for the second of the balanced antennas 10, incorporating the matching network, is about −12.14 dB, and the return loss for the large coupling element 112, incorporating the matching network, is about −23.41 dB. Fit is also shown that the isolations between these antennas are about −10.885 dB between the two balanced antennas, −16.88 dB between the chassis antenna and the second balanced antenna and −17.07 dB between the chassis antenna and the first balanced antenna.

Figure 20:
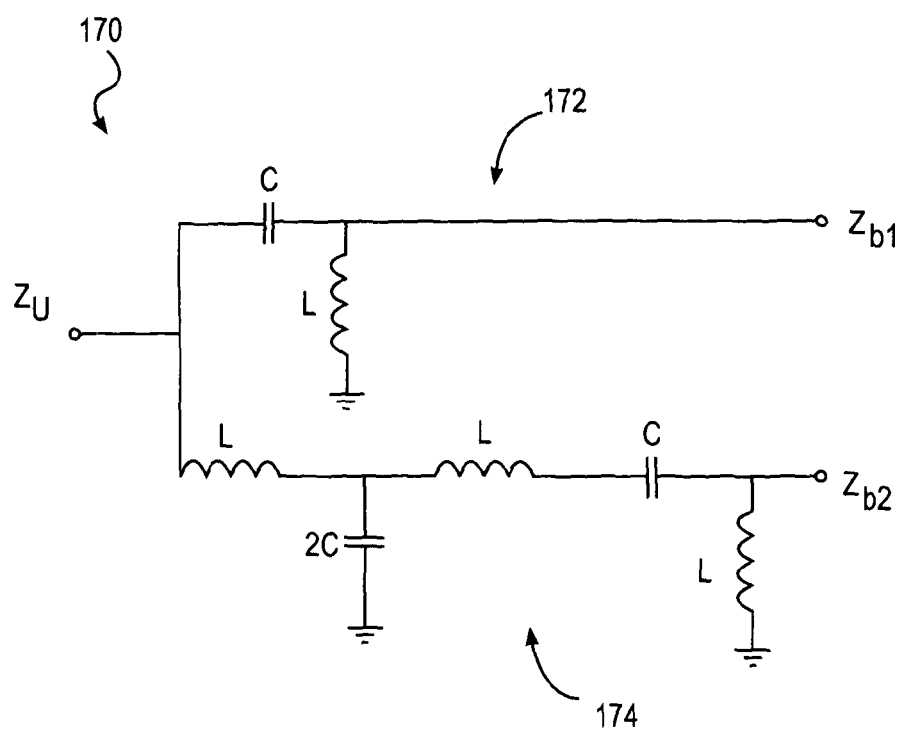
FIG. 20 shows a circuit diagram for an alternative balun configuration for use in embodiments of the present invention.

FIG. 20 shows a circuit diagram for an alternative balun 170 which may be used in embodiments of the present invention. The balun 170 comprises an LC circuit substantially as described by Yeh, Liu and Chiou in 'Compact 28-GHz Subharmonically Pumped Resistive Mixer MMIC Using a Lumped-Element High-Pass/Band-Pass Balun', published in IEEE Microwave and Wireless Components Letters, Vol. 15, No. 2, February 2005.

As shown, the balun 170 comprises a high pass filter (first filter) 172 and a band pass filter (second filter) 174. A first (unbalanced) port $Z_u$ is connected to the high pass filter 172 and the band pass filter 174 via a T-junction. The high pass filter 172 comprises a capacitor C and an inductor L, and the output from which constitutes an impedance $Z_{b1}$. The band pass filter 174 comprises three inductors and two compactors, and the output from which constitutes an impedance $Z_{b2}$. In this embodiment, it should be noted that the inductors L are all identical but, in the band pass filter 174, one of the capacitors (constituting a shunt capacitor labelled 2C) is double the value of other capacitors C.

It will be noted that the balun 170 is essentially an out-of-phase power splitter which includes one high pass filter 172 and one band pass filter 174 connected in parallel. Although this balun 170 can provide wide bandwidth operation (and has fewer components than the balun 50 described above, resulting in less loss), in practice, the balun 170 may provide less than 180 degrees of phase difference between the unbalanced outputs $Z_{b1}$ and $Z_{b2}$. Thus, in embodiments where a 180 degree phase difference is required it may be more convenient to employ a balun of the type shown in FIG. 2 and in embodiments where a 180 degree phase difference is not required it may more convenient to employ a balun of the type shown in FIG. 20.

It has also been found that where the balun 170 is employed in embodiments of the invention, it is possible to obtain the desired tuning range of about 470 to 2200 MHz by employing only one balun 170 configuration and only two configurations for each of the first and second matching circuits. Thus, a simpler circuit can be employed when compared to the embodiment shown in FIGS. 5A and 5B.

Figure 21A:
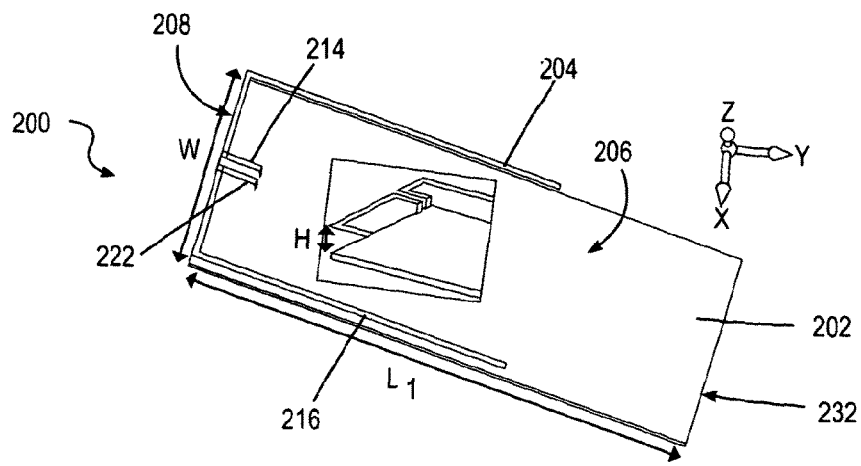
FIG. 21A shows a front view of a balanced antenna according to a further embodiment of the present invention.
Figure 21B:
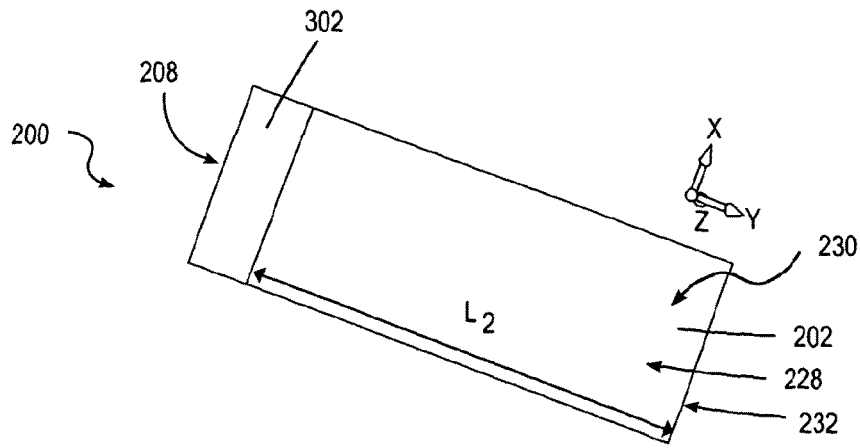
FIG. 21B shows a back view of the balanced antenna of FIG. 21A.
Figure 21C:
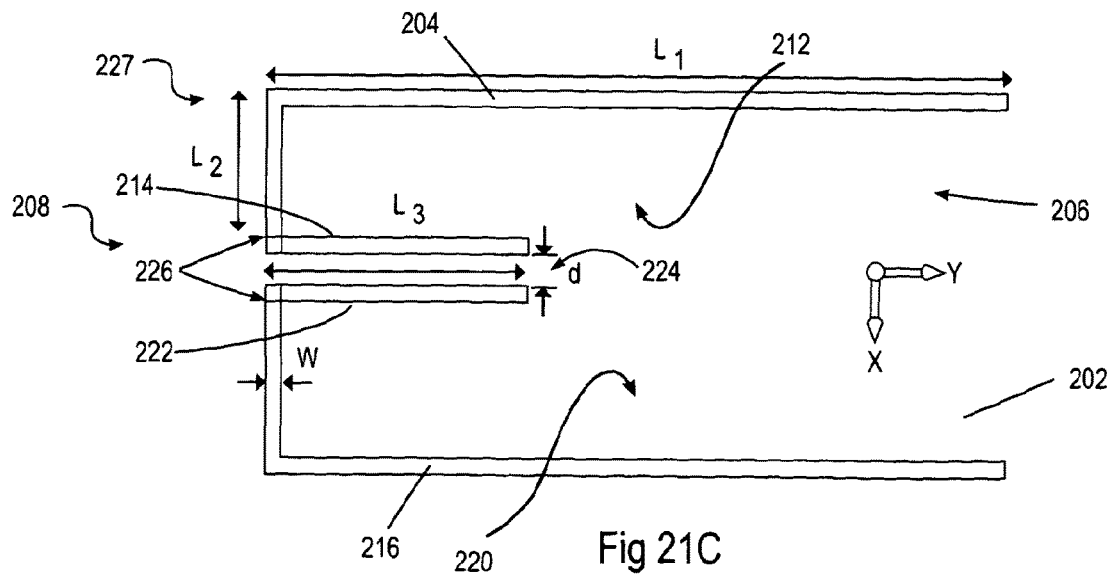
FIG. 21C shows an enlarged plan view of the radiating element shown in FIG. 21A.

A balanced antenna system 200 according to a further embodiment of the present invention is illustrated in FIGS. 21A through 21C. As described above, the balanced antenna system 200 is reconfigurable, as will be described in more detail below, and is designed for use in a portable product such as a mobile phone, laptop or PDA.

The balanced antenna system 200 is provided on a microwave substrate 202 (e.g. a printed circuit board, PCB) having a length $L_1$ of approximately 110 mm, a width W of approximately 40 mm and a thickness H of approximately 5 mm so that the system can easily be accommodated in a conventional mobile phone.

As best illustrated in FIG. 21C, a first radiating element 204 is provided on a first side 206 of the substrate 202, at a first end portion 208 thereof. The first radiating element 204 is constituted by a substantially L-shaped first strip layer which is located in one half of the substrate 202 towards the first end portion 208 and is orientated such that its open side 212 faces inwardly towards the central region of the first end portion 208. A short feed line 214 is provided at a start of the first radiating element 204 closest to the centre of the substrate 202 and extends along the length of the substrate 202.

A second radiating element 216, which is substantially similar to the first radiating element 204, is also provided on the first side 206 of the substrate 202 and is located in an adjacent half of the first end portion 208 of the substrate 202. The second radiating element 216 is therefore constituted by a substantially L-shaped second strip layer which is also orientated such that its open side 220 faces inwardly towards the central region of the first end portion 208. Thus, the second radiating element 216 is orientated in an opposite direction to the first radiating element 204. A short feed line 222 is again provided at a start of the second radiating element 216 closest to the centre of the substrate 202 and extends along the length of the substrate 202.

A gap 224 is provided between the respective feed lines 214, 222 of the first and second radiating elements 204, 216 and between the respective ends 226 of the first and second strips. Accordingly, the first and second radiating elements 204, 216 form a large dipole antenna 227. In the embodiment shown in FIG. 21C, the first and second radiating elements 204, 166 have a long side $l_1$ extending approximately 70 mm along the length of the substrate 202 and a short side $l_2$ extending approximately 19 mm along the width of the substrate 202. The width w of each of the first and second strips is approximately 1 mm and the gap 224 has an extent d of approximately 2 mm. Each of the feed lines 214, 222 has a length $l_3$ of approximately 10 mm.

As shown in FIG. 21B, a ground plane 228 is provided on a second side 230 of the substrate 202, opposite to the first side 206. The ground plane 228 is substantially rectangular and occupies substantially the whole of the substrate 202 surface from a second end 232 thereof (opposite to the first end portion 208) to a position substantially opposite the free ends of the feed lines 214, 222. The ground plane 228 has a length $L_2$ of approximately 100 mm and extends over the entire width W of the substrate 202.

The balanced antenna system 200 also includes a balun and two matching circuits which are connected to the first and second radiating elements 204, 216 and which are not shown in FIGS. 21A through 21C for reasons of clarity but which would be provided on the first side 206 of the substrate 202, opposite to the ground plane 228.

Figure 22:
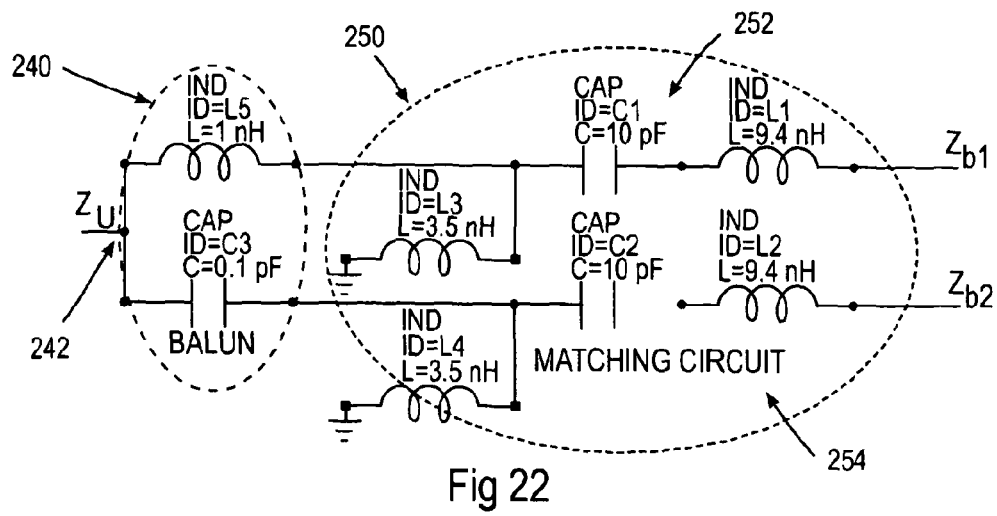
FIG. 22 shows a balun and matching circuit arrangement for the antenna of FIGS. 21A through 21C.

FIG. 22 shows a circuit diagram of a suitable balun 240 and matching circuit arrangement 250 for the antenna 200 of FIGS. 21A through 21C. The balun 240 comprises one inductor L5 (of 1 nH) and one capacitor C3 (of 0.1 pF) which are connected in parallel branches from a T-junction 242 which splits an unbalanced signal $Z_u$. The matching circuit arrangement 250 comprises a first matching circuit 252 connected to the inductor L5 of the balun 240 and which terminates in a balanced signal $Z_{b1}$ which in practice is fed into the feed line 214 of the first radiating element 204, and a second matching circuit 254 connected to the capacitor C3 of the balun 240 and which terminates in a balanced signal $Z_{b2}$ which in practice is fed into the feed line 222 of the second radiating element 216. The first and second matching circuits 252, 254 each comprise an inductor L3, L4 (each of 3.5 nH), a capacitor C1, C2 (each of 10 pF) and a second inductor L1, L2 (each of 9.4 nH). In each case the capacitor C1, C2 may be replaced by a varactor capable of varying from 10 pF to 0.2 pF.

Figure 23:
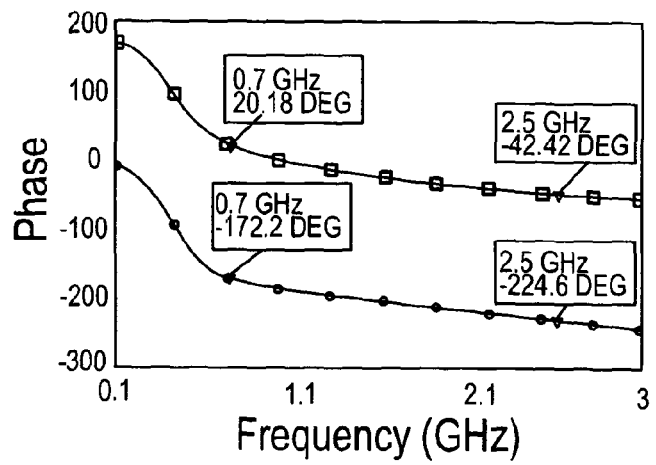
FIG. 23 shows a graph of phase against frequency for the outputs $Z_{b1}$ and $Z_{b2}$ of the circuit of FIG. 22.

As shown in FIG. 23, the integration of the first and second matching circuits 252 and 254 and the balun 240 has been optimised to produce a required phase difference of about 180° in order to transfer the balanced feeds $Z_{b1}$ and $Z_{b2}$ to the unbalanced feed $Z_u$ within a required operating bandwidth.

Figure 24:
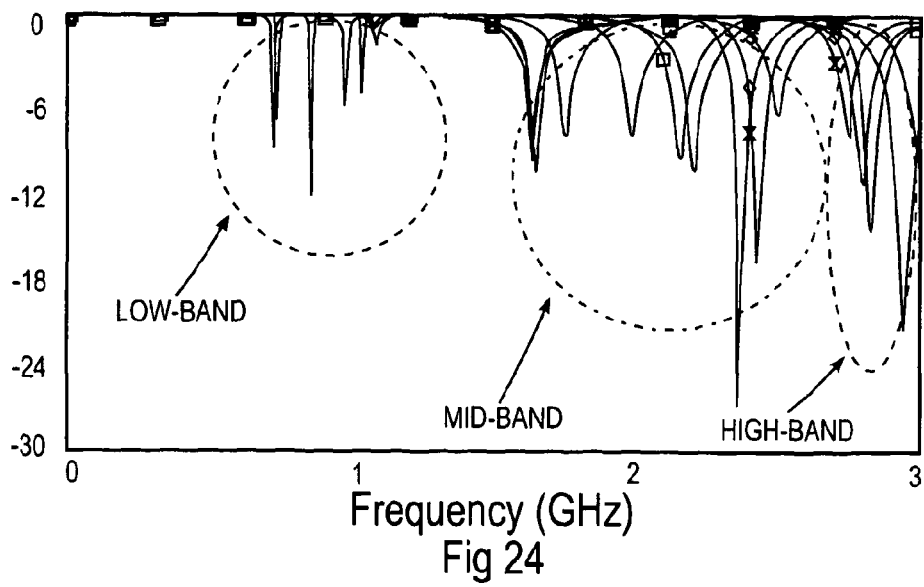
FIG. 24 shows simulated reflection coefficients against frequency for when the varactors in the matching circuit of FIG. 22 are varied from 10 pF to 0.2 pF.

FIG. 24 shows simulated reflection coefficients against frequency for the large balanced antenna 200 when fed by the circuit of FIG. 22. More specifically, the balanced antenna is configured to provide three resonances simultaneously and the varactors (denoted as $C_1$ and $C_2$) in the matching circuit arrangement 250 can be varied from 10 pF to 0.2 pF to move the three resonant frequencies simultaneously to cover the low-band (from 700 MHz to 1010 MHz), the mid-band (from 1620 MHz to 2490 MHz) and the high-band (from 2740 MHz to over 3000 MHz), while maintaining a return loss above 6 dB. Accordingly, the present antenna structure 200 is able to provide high efficiency within the required operating bands even when taking into account the loss of real components. Further optimisation of the antenna structure or the addition of further matching circuits could be used to cover any remaining frequency bands of interest.

Figure 25A:
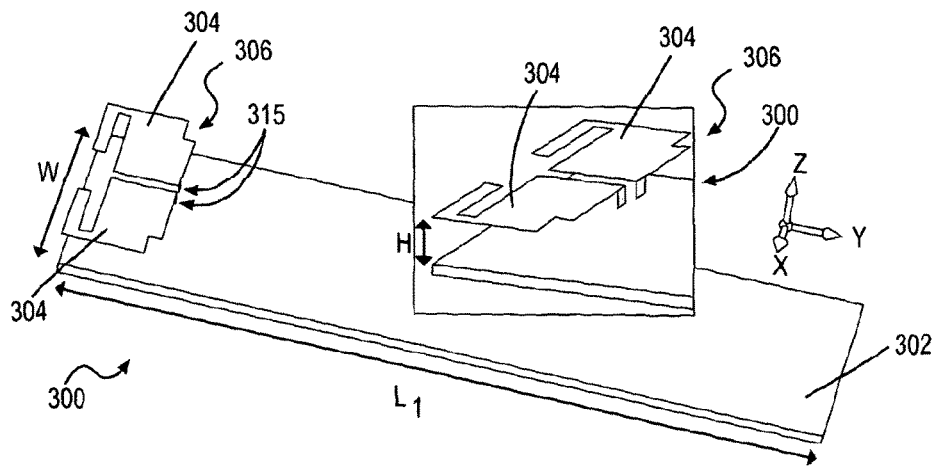
FIG. 25A shows a front perspective view plus an enlarged detail view of a balanced antenna according to another embodiment of the present invention.
Figure 25B:
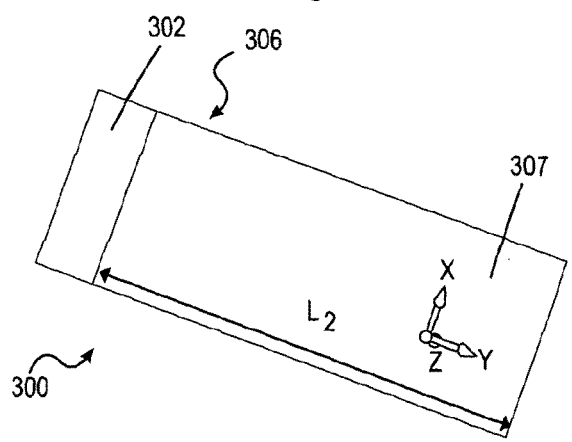
FIG. 25B shows a rear view of the balanced antenna of FIG. 25A.
Figure 25C:
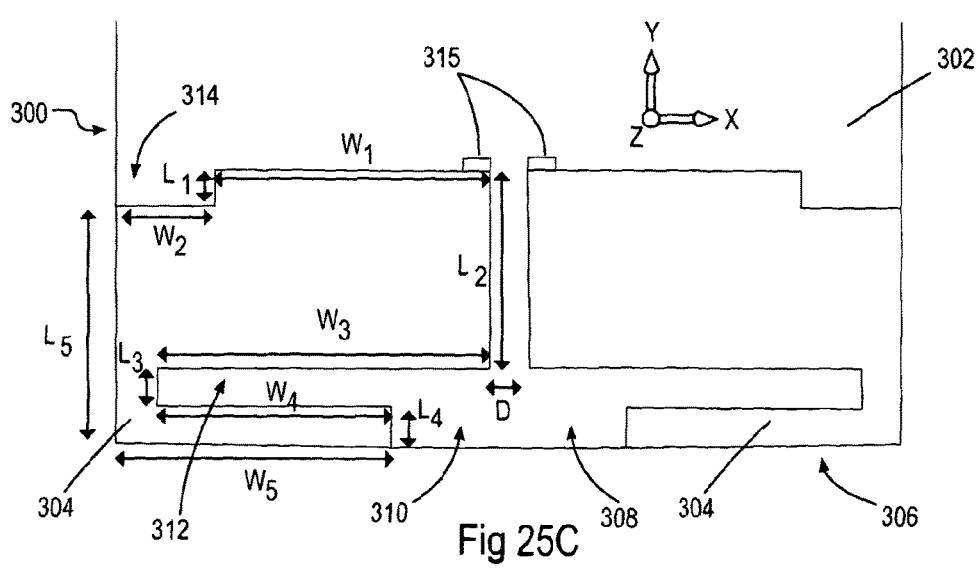
FIG. 25C shows a front plan view of the radiating elements of the balanced antenna of FIGS. 25A and 25B.

FIGS. 25A, 25B and 25C show a reconfigurable balanced dipole antenna 300 according to another embodiment of the present invention, which has a single tunable resonant frequency. The balanced antenna 300 is provided on a microwave substrate 302, Taconic TLY-3-0450-C5, which has a permittivity of 2.33, loss tangent of 0.0009, a thickness of 1.143 mm, a length $L_1$ of approximately 114 mm and a width W of approximately 40 mm. The antenna 300 comprises two metallic radiating elements 304 mounted at a first end 306 of the substrate 302 and which extend substantially over the width W of the substrate 302, such that they occupy a total area of approximately 40 mm×14 mm. The radiating elements 304 have a metal thickness of 0.01778 mm and are mounted at a height H of 5 mm above the substrate 302, for example using spacers (not shown). Thus, the antenna 300 can easily be accommodated in a conventional mobile phone.

As shown in FIG. 25B, a metal ground plane 307 is provided on a rear of the substrate 302. The ground plane 307 occupies an area of 100×40 mm$^2$ and terminates at a position opposite the end of the region where the radiating elements 304 are disposed.

The radiating elements 304 are symmetrically arranged on either side of a central longitudinal axis of the substrate 302 such a gap d of 2 mm is provided between each radiating element 304. Although each radiating element 304 is substantially rectangular, an L-shaped cut-out 308 is provided adjacent the first end 306 such that an inner portion 310 of each rectangle is missing at the first end 306 and a transverse slit 312 is provided a short distance from the first end 306, which extends from the missing inner portion 310 to a position close to but spaced from the edge of the substrate 302. At an outer edge of each radiating element 304, at an end opposite to the first end 306, there is provided a further cut-out in the shape of a small rectangle 314. A feed line 315 is provided adjacent an inner edge of each of the radiating elements 304, at the end opposite to the first end 306, for connecting the radiating elements 304 to a control circuit as will be described below. The dimensions of all of the features of the balanced antenna 300 are given in Table 3 below.

TABLE 3

Dimensions for the antenna shown in FIGS. 25A to 25C

| H | 5 mm | $w_4$ | 12 mm |
|---|---|---|---|
| W | 40 mm | $w_5$ | 14 mm |
| $L_1$ | 114 mm | $l_1$ | 2 mm |
| $L_2$ | 100 mm | $l_2$ | 10 mm |
| $w_1$ | 14 mm | $l_3$ | 2 mm |
| $w_2$ | 5 mm | $l_4$ | 2 mm |
| $w_3$ | 17 mm | $l_5$ | 12 mm |

Figure 26:
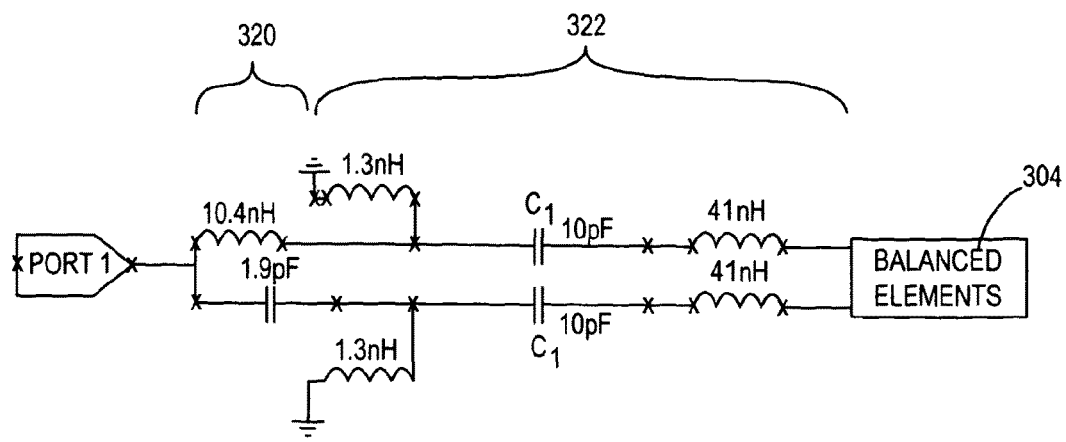
FIG. 26 shows a circuit diagram comprising a balun and matching circuit arrangement for the antenna of FIGS. 25A through 25C.

FIG. 26 shows a circuit diagram comprising a balun 320 and matching circuit 322 for the antenna 300 of FIGS. 25A through 25C. In practice, the balun 320 and matching circuit 320 are provided on the substrate 302, opposite to the ground plane 307 and are connected to the radiating elements 304 via the feed lines 315. In this embodiment, the balun 320 comprises an inductor of 10.4 nH and a capacitor of 1.9 pF connected in parallel. The matching circuit 322 comprises two identical circuits, each of which is connected between a branch of the balun 320 and one of the radiating elements 304, and comprises an inductor of 1.3 nH connected in parallel with a varactor $C_1$ of up to 10 pF, which in turn is connected in series with an inductor of 41 nH.

Figure 27:
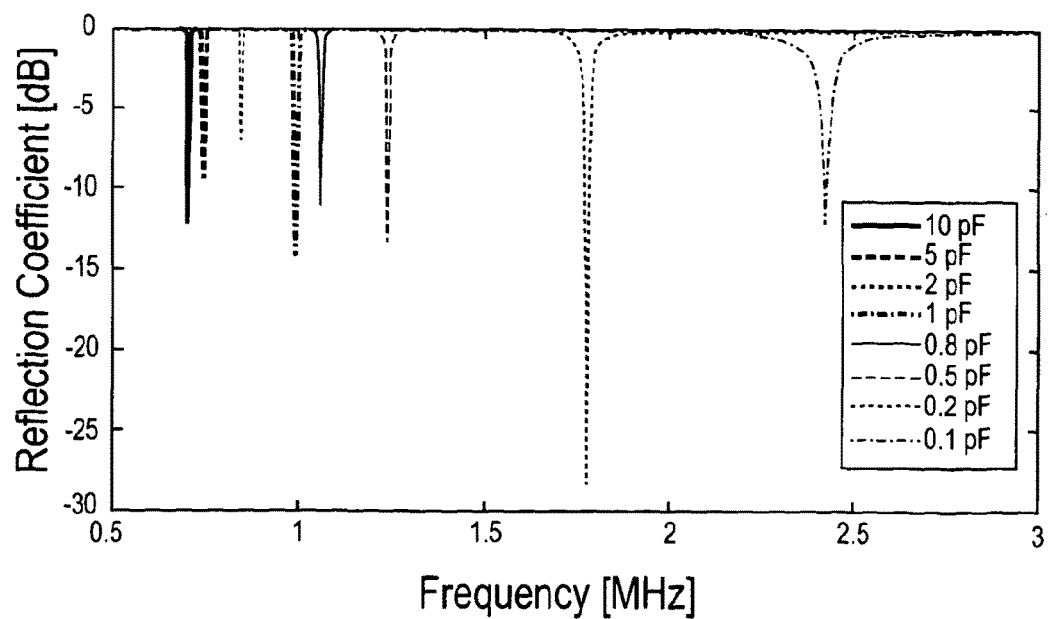
FIG. 27 shows simulated reflection coefficients against frequency for when the varactors in the circuit of FIG. 26 are varied from 10 pF to 0.1 pF.

As illustrated in FIG. 27, by varying the varactors $C_1$ of FIG. 26 from 10 pF to 0.1 pF it is possible to tune the frequency of the antenna 300 from approximately 700 MHz up to 2434 MHz, with at least 6 dB return loss. For the DVB-H band or beyond 2500 MHz, further matching circuits could be provided. Thus, although the antenna 300 has high dissipated loss on the lumped elements in the circuit and low efficiency at low frequency such as 700 MHz, its size is suitable for MIMO applications in small terminals, for example, Watch Cell Phones.

In a further embodiment of the present invention, there is provided a reconfigurable balanced antenna of the same structure as illustrated in FIGS. 21A to 21C and having the dimensions detailed in table 4 below.

TABLE 4

Dimensions for the antenna shown in FIGS. 21A to 21C

| H | 5 mm | $L_1$ | 110 mm |
|---|---|---|---|
| W | 40 mm | $L_2$ | 100 mm |
| $l_1$ | 50 mm | $l_2$ | 19 mm |
| $l_3$ | 10 mm | d | 2 mm |
| w | 1 mm | — | — |

Thus, the antenna comprises L-shaped dipole arms, 50 mm×40 mm in size, with a 1 mm track width, a metal thickness of 0.01778 mm and has a total size of 110×40 mm$^2$ and ground plane size of 100×40 mm$^2$. The antenna was constructed on a microwave substrate material, Taconic TLY-3-0450-05, which has a permittivity of 2.33, loss tangent of 0.0009 and a thickness of 1.143 mm.

Figure 28:
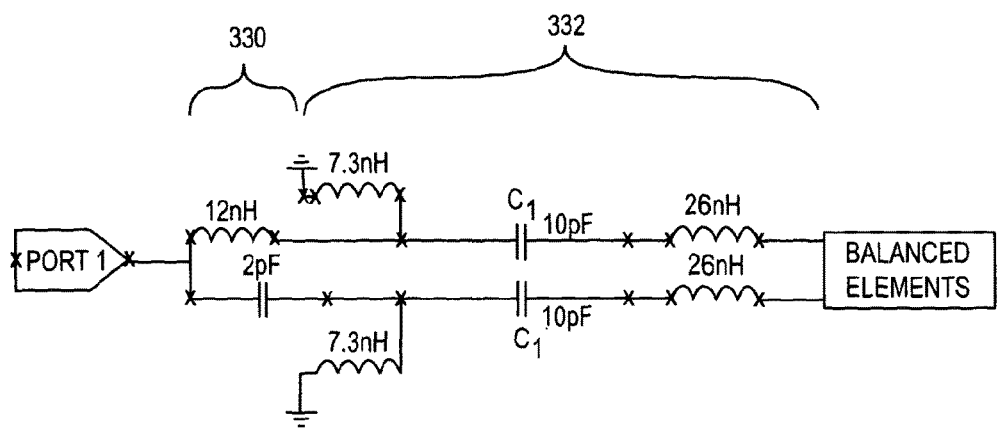
FIG. 28 shows an alternative circuit diagram comprising a balun and matching circuit arrangement for the antenna of FIGS. 21A through 21C.

FIG. 28 shows a circuit diagram for the antenna described above. This circuit comprises a balun 330 and matching circuit 332 which would be provided on the substrate 202, opposite to the ground plane 228 and would be connected to the radiating elements 204, 216 via the feed lines 214, 222. In this embodiment, the balun 330 comprises an inductor of 12 nH and a capacitor of 2 pF connected in parallel. The matching circuit 332 comprises two identical circuits, each of which is connected between a branch of the balun 330 and one of the radiating elements 204, 216, and comprises an inductor of 7.3 nH connected in parallel with a varactor $C_1$ of up to 10 pF, which in turn is connected in series with an inductor of 26 nH.

Figure 29:
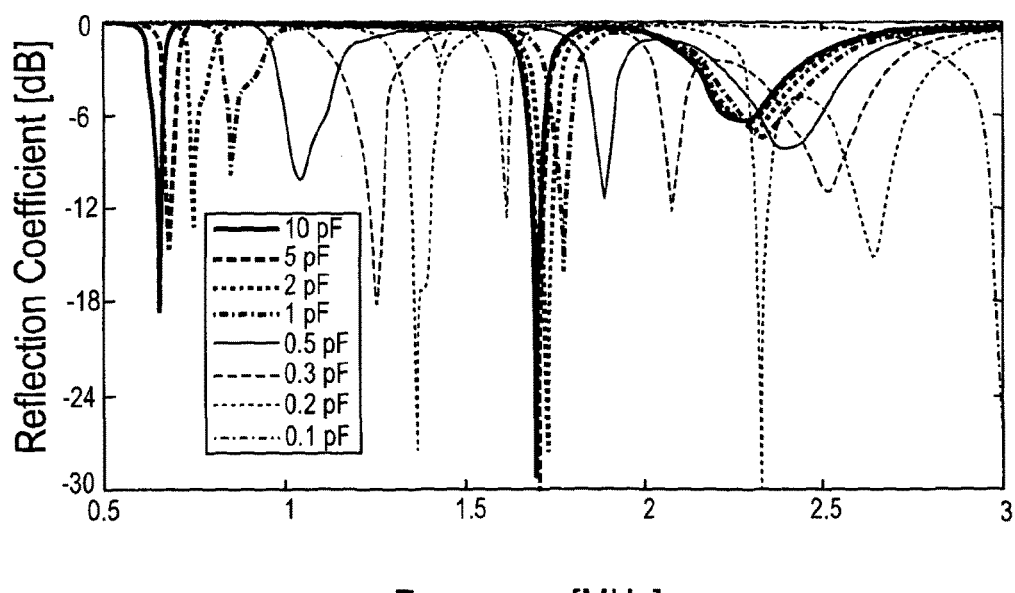
FIG. 29 shows simulated reflection coefficients against frequency for when the varactors in the circuit of FIG. 28 are varied from 10 pF to 0.1 pF.

As illustrated in FIG. 29, by varying the varactors $C_1$ of FIG. 28 from 10 pF to 0.1 pF it is possible to tune three separate frequencies to simultaneously cover from 633 MHz to over 3000 MHz with at least 6 dB return loss. More specifically, it is possible to tune the low-band resonance frequency from 648 MHz to 1616 MHz, the mid-band resonance frequency from 1704 MHz to 2560 MHz and the high-band resonance frequency from 2280 MHz to over 3000 MHz while maintaining a return loss above 6 dB. For the DVB-H band, further matching circuits may be employed. Thus, despite some dissipated loss in the lumped elements and substrate, leading to low efficiency at low frequencies, the exceptional tuning range makes this antenna suitable for MIMO applications in small terminals, particularly when constructed from lower loss materials.

Figure 30:
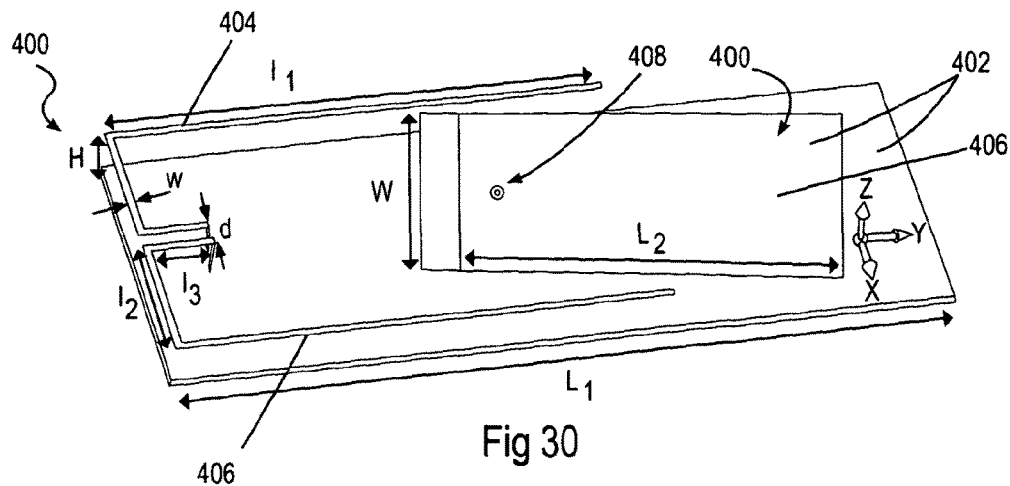
FIG. 30 shows a front and rear view of a further balanced antenna according to an embodiment of the present invention.

FIG. 30 shows a front and rear view of a further reconfigurable balanced antenna 400 according to an embodiment of the present invention. The antenna 400 is similar to that described above and shown in FIGS. 21A through 21C but this time has the dimensions detailed in Table 5 below.

TABLE 5

Dimensions for the antenna showed in FIG. 30

| H | 5 mm | $L_1$ | 110 mm |
|---|------|-------|--------|
| W | 40 mm | $L_2$ | 100 mm |
| $l_1$ | 70 mm | $l_2$ | 19 mm |
| $l_3$ | 10 mm | d | 2 mm |
| w | 1 mm | — | — |

Thus, the antenna 400 comprises L-shaped dipole radiating elements 404, 70 mm×40 mm in size, with a 1 mm track width, a metal thickness of 0.01778 mm and has a total size of 110×40 mm² and ground plane 406 of 100×40 mm². The antenna was constructed on a microwave substrate material 402, Taconic TLY-3-0450-C5, which has a permittivity of 2.33, loss tangent of 0.0009 and a thickness of 1.143 mm. A port 408 is provided on the ground plane 406 for driving the radiating elements 404 via a suitable circuit.

Figure 31:
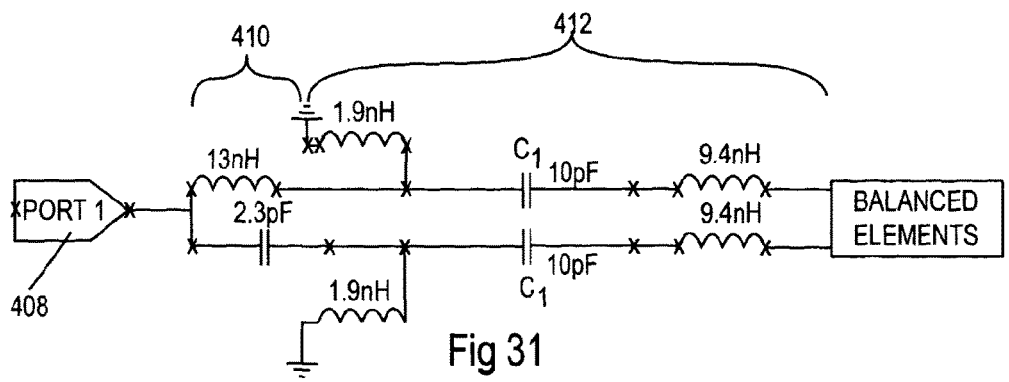
FIG. 31 shows a circuit diagram comprising a balun and matching circuit arrangement for the antenna of FIG. 30.

FIG. 31 shows such a circuit diagram for the antenna 400. This circuit comprises a balun 410 and matching circuit 412 which would be provided on the substrate 402, opposite to the ground plane 406 (but drivable through the port 408) and would be connected to the radiating elements 404 via feed lines. In this embodiment, the balun 410 comprises an inductor of 13.2 nH and a capacitor of 2.3 pF connected in parallel. The matching circuit 412 comprises two identical circuits, each of which is connected between a branch of the balun 410 and one of the radiating elements 404, and comprises an inductor of 1.9 nH connected in parallel with a varactor $C_1$ of up to 10 pF, which in turn is connected in series with an inductor of 9.4 nH.

Figure 32:
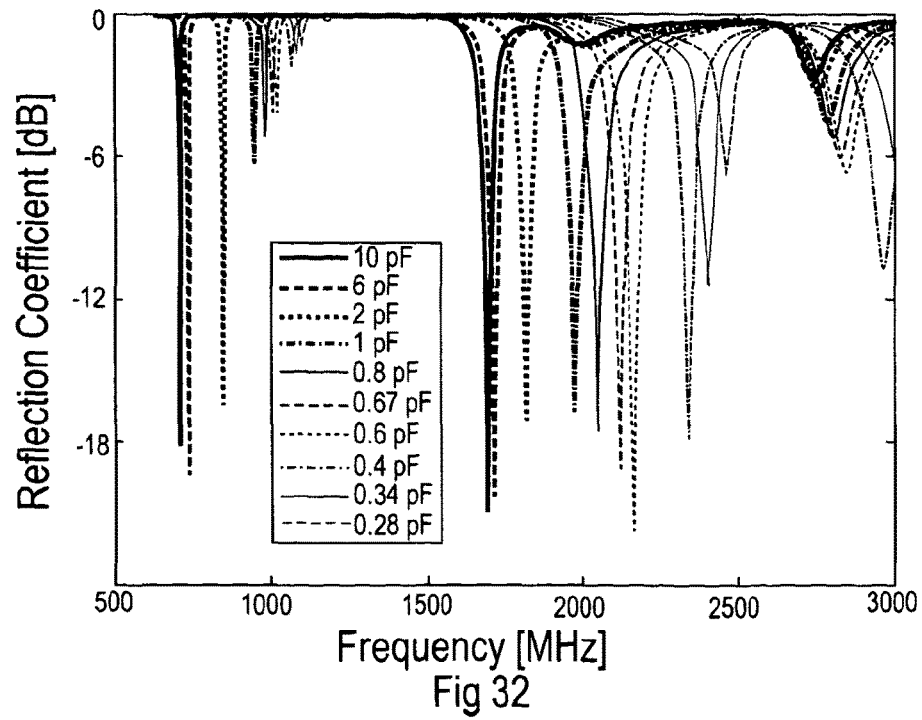
FIG. 32 shows simulated reflection coefficients against frequency for when the varactors in the circuit of FIG. 31 are varied from 10 pF to 0.28 pF.

As illustrated in FIG. 32. by varying the varactors $C_1$ of FIG. 31 from 10 pF to 0.28 pF it is possible to tune three separate frequencies to simultaneously cover from 705 MHz to over 3000 MHz with at least 6 dB return loss. More specifically, it is possible to tune the low-band resonance frequency from 705 MHz to 951 MHz, the mid-band resonance frequency from 1692 MHz to 2457 MHz and the high-band resonance frequency from 2826 MHz to over 3000 MHz while maintaining a return loss above 6 dB. The simulation results, using ideal components, therefore show that the antenna 400 has three-band behaviour. The low-band and mid-band can cover most of the existing cellular services, since the low-band can be tuned to cover LTE700, GSM850 and EGSM900 and the mid-band can be tuned to cover PCN, GSM1800, GSM1900, PCS and UMTS. The applicants have also found that incorporating real components provides at least −3.77 dB of total efficiency at 684 MHz. It is therefore believed that the antenna 400 can address the low efficiency problem that may be associated with some of the previous embodiments at low frequencies.

Figure 33A:
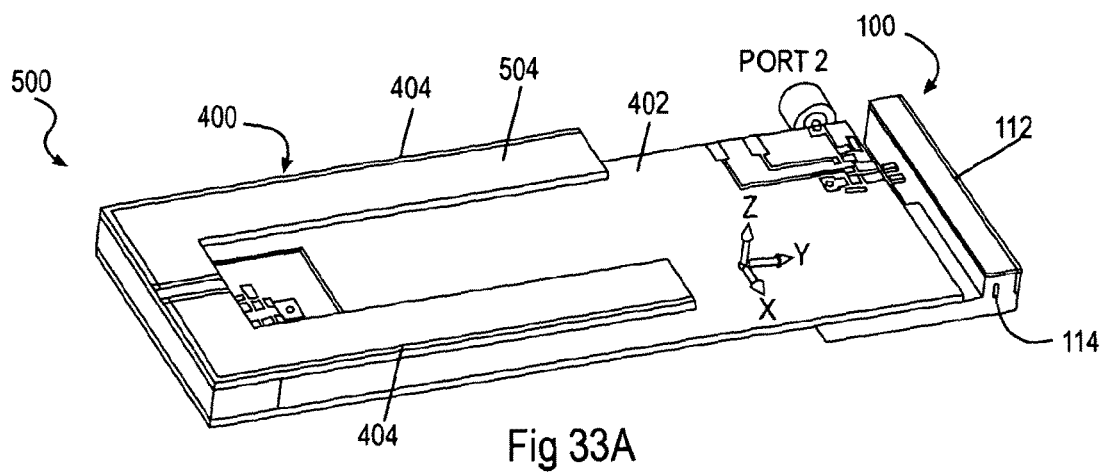
FIG. 33A shows a front perspective view of another balanced antenna according an embodiment of the present invention.
Figure 33B:
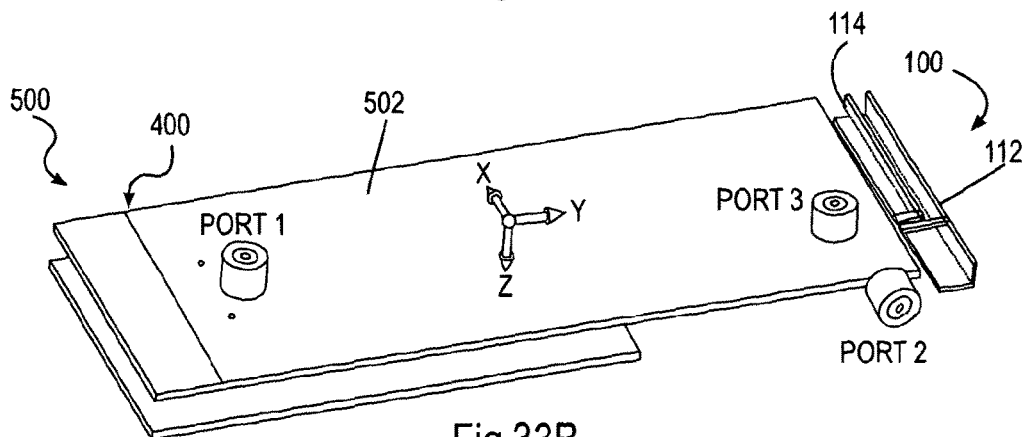
FIG. 33B shows a rear perspective view of the balanced antenna of FIG. 33A.

FIGS. 33A and 33B show, respectively, a front and rear view of another balanced antenna 500 according an embodiment of the present invention and which is suitable for Multiple-Input-Multiple-Output (MIMO) applications. The antenna 500 essentially comprises the antenna 400 of FIG. 30 combined with a two-port chassis-antenna 100 as shown in FIGS. 9A and 9B and as described above. Thus, the two-port chassis antenna 100 is of the type described in detail in GB0918477.1 and comprises a pair of non-resonant coupling elements 112, 114, that are capable of simultaneous dual-band operation.

The MIMO antenna 500 has a total size of 118×40 mm² and a ground plane 502 of 100×40 mm². The chassis antenna 100 occupies a small volume of 40×4×7 mm³ and is mounted off a second end of the substrate 402, opposite to the end where the radiating elements 404 are disposed. As shown in FIG. 33A, the radiating elements 404 are provided on an additional U-shaped substrate 504 which is wider and longer than the radiating elements 404 themselves, to provide mechanical support. The balanced antenna element 400 and the coupling elements 112, 114 in the chassis antenna 100 are supported by Rohacell™ material. A first port, Port 1, is provided through the ground plane 502 for driving the radiating elements 404 via a suitable circuit. Similarly, a second port, Port 2, is provided on an edge of the substrate 402 for driving coupling element 114 and a third port, Port 3, is provided through the second end of the ground plane 502 for driving coupling element 112.

Figure 34:
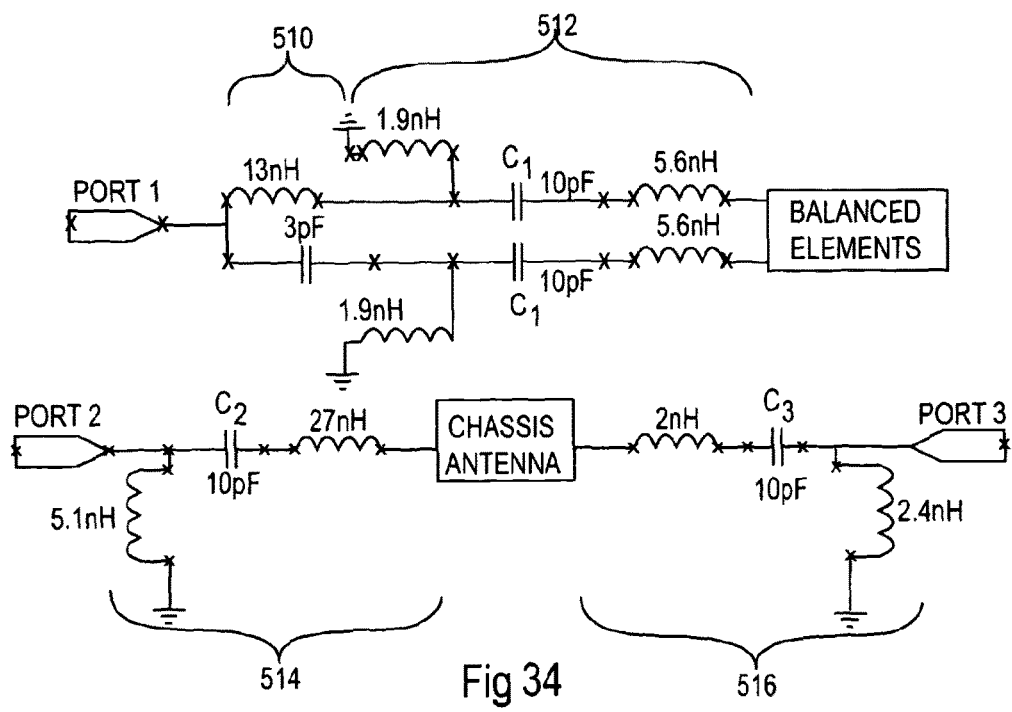
FIG. 34 shows circuit diagrams for driving each of the radiating elements in the antenna of FIGS. 33A and 33B.

FIG. 34 shows circuit diagrams for the elements provided between each of the ports and their respective radiating and coupling elements 404, 112, 114. Thus, for the balanced antenna 400, Port 1 is connected to a balun 510 comprising an inductor of 13 nH and a capacitor of 3 pF connected in parallel. Each arm of the balun 510 is then connected to one of the radiating elements 404 via an identical matching circuit 512. Each matching circuit 512 comprises an inductor of 1.9 nH connected in parallel with a varactor $C_1$ of up to 10 pF, which in turn is connected in series with an inductor of 5.6 nH. For the chassis-antenna 100, a first L-network matching circuit 514 is connected between Port 2 and coupling element 114 and a second L-network matching circuit 516 is connected between Port 3 and coupling element 112. The first matching circuit 514 comprises a parallel inductor of 5.1 nH connected to a varactor $C_2$ of up to 10 pF, which in turn is connected in series to an inductor of 27 nH. The second matching circuit 516 comprises a parallel inductor of 2.4 nH connected to a varactor $C_3$ of up to 10 pF, which in turn is connected in series to an inductor of 2 nH.

The MIMO antenna 500 was simulated in CST Microwave Studio® and the s4p file representing the frequency response of the antenna was then used to determine the optimum component values detailed above for each matching circuit using Microwave Office, from Applied Wave Research.

The antenna 500 was also demonstrated with the four varactor diodes $C_1$, $C_1$, $C_2$, $C_3$ being of the type MV34003-150A, having a capacitance variable from 0.409 pF to 15.435 pF (which was broader than the range described above) for an applied voltage of 0 V to 15 V. A dc bias line, incorporating a 10 kΩ resistor, was attached to the anode of each varactor to supply positive voltage. The resistor was employed for damping any residual RF signals appearing on the dc line. The negative voltage was supplied from an inner conductor of an SMA connector (i.e. a coaxial RF connector having a 50 Ohm impedance) by using a bias-tee ZX85-122G-S+, from Mini-Circuits®.

Figure 35:
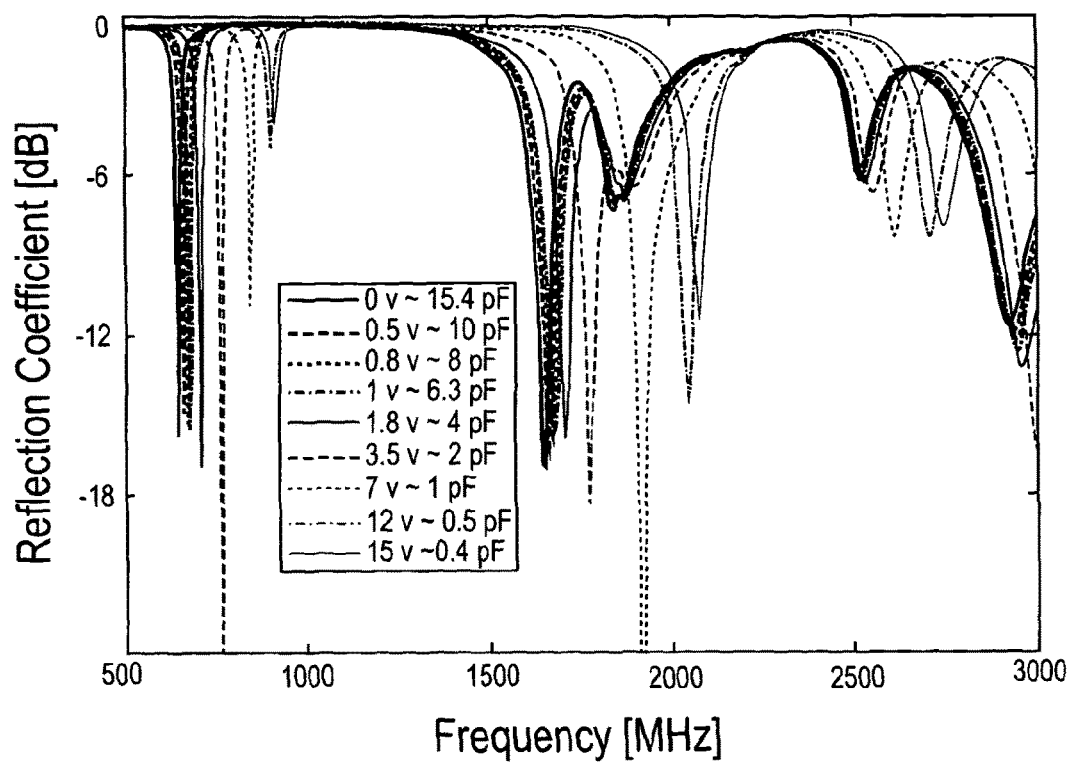
FIG. 35 shows measured reflection coefficients against frequency for when the varactors in the circuit of FIG. 34 are varied from approximately 15.4 pF to 0.4 pF.

FIG. 35 shows measured reflection coefficients against frequency for when the varactors in the circuit of FIG. 34 are varied from approximately 15.4 pF to 0.4 pF. Thus, it can be seen that the antenna 500 can be operated in three simultaneous bands. Ports 2 and 3, of the chassis-antenna 100, were open circuit during the measurement. The voltage across the varactors was varied from 0 V to 15 V and the resulting resonant frequencies varied from 646 MHz to 848 MHz for the low band, 1648 MHz to 2074 MHz for the mid-band and 2512 MHz to over 3000 MHz for high band, while maintaining a return loss above 6 dB. Table 6 below shows the measured reflection coefficient for both ports of the chassis-antenna 100 while the varactor voltages are varied from 0 V to 15 V. During measurements on each port, the other two ports are left open circuit. Unlike the balanced antenna 400 each port of the chassis antenna 100 drives a single resonance. The frequencies of each port vary from 597 MHz to 1124 MHz and 1586 MHz to 2332 MHz, respectively. Thus, the antenna 500 provides MIMO operation from 646 MHz to 848 MHz and 1648 MHz to 2074 MHz. It is also likely that the frequency tuning range could be increased, if the capacitance tuning range of the varactors was wider.

The instantaneous bandwidth at various frequencies for ports 2 and 3 are also shown in Table 6. The bandwidth of port 1 for the same frequencies is also shown. The smallest of these thus represent the instantaneous MIMO bandwidth. It can be seen that port 2 gives a considerably narrower bandwidth than port 3. Table 6 shows that the minimum MIMO bandwidth is 14 MHz (at 771 MHz centre frequency) and the maximum MIMO bandwidth is 93 MHz (at 1812 MHz centre frequency).

TABLE 6

Measured refection coefficients for Ports 2 and 3 (Chassis Antenna) as varactors varied from 0 V to 15 V respectively

|  | Voltage (V) | Freq. (MHz) | Refl. Coeff. (dB) | Bandwidth@ 6 dB (MHz) | Bandwidth for Port 1 at same frequency (MHz) |
|---|---|---|---|---|---|
| Port 2 | 0 | 597 | −19.72 | 39 | — |
|  | 1 | 644 | −21.30 | 42 | 17 |
|  | 3.5 | 771 | −32.71 | 34 | 14 |
|  | 7 | 921 | −18.32 | 44 | — |
|  | 12 | 1075 | −12.03 | 41 | — |
|  | 15 | 1124 | −10.62 | 35 | — |
| Port 3 | 0 | 1586 | −21.60 | 236 | — |
|  | 1 | 1631 | −25.97 | 289 | 73 |
|  | 3.5 | 1812 | −15.89 | 233 | 93 |

TABLE 6-continued

Measured refection coefficients for Ports 2 and 3 (Chassis Antenna) as varactors varied from 0 V to 15 V respectively

| Voltage (V) | Freq. (MHz) | Refl. Coeff. (dB) | Bandwidth@ 6 dB (MHz) | Bandwidth for Port 1 at same frequency (MHz) |
|---|---|---|---|---|
| 7 | 2067 | −18.41 | 224 | 61 |
| 12 | 2300 | −25.11 | 204 | — |
| 15 | 2332 | −23.91 | 189 | — |

Table 7 below gives the measured S parameters for the MIMO antenna 500. It is clear from these results that isolation is good as S21 is at least 15 dB over all of the bands.

TABLE 7

Measured S parameters for the MIMO antenna of FIG. 33A-B

| Voltage (V) | Ports | Frequency (MHz) | S11 (dB) | S22 (dB) | S21 (dB) |
|---|---|---|---|---|---|
| 0* & 1.3+ | 1 & 2 | 646 | −16.85 | −32.14 | −20.15 |
| 1.72* & 2.53+ | 1 & 2 | 710 | −16.25 | −27.21 | −17.17 |
| 6.85* & 5.6+ | 1 & 2 | 850 | −10.85 | −36.53 | −18.25 |
| 0* & 1.1+ | 1 & 3 | 1645 | −14.62 | −25.36 | −26.57 |
| 1.9* & 2.1+ | 1 & 3 | 1710 | −16.01 | −18.71 | −25.40 |
| 12* & 6.4+ | 1 & 3 | 2050 | −13.09 | −14.54 | −15.58 |

*applied voltage to the varactors of the balanced antenna

Figure 36:
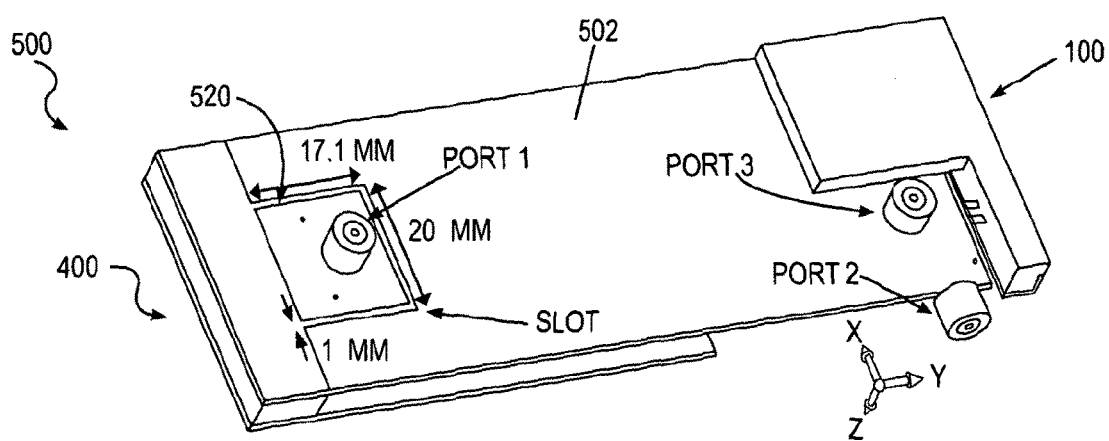
FIG. 36 shows a view similar to that of FIG. 33B but wherein the ground plane has been modified to include a slot.

FIG. 36 shows a view similar to that of FIG. 33B but wherein the ground plane 502 has been modified to include a U-shaped slot 520 around Port 1. For certain applications it is desirable for the MIMO antenna 500 to have a total efficiency of at least −4.5 dB for the main transmission and reception antenna (e.g. the chassis antenna 100) and −5.5 dB for the second reception antenna (e.g. the balanced antenna 400). However, it was noted that the realized gain of the chassis antenna 100, when integrated with the balanced antenna 400 in accordance with FIGS. 33A and 33B, dropped at least 5 dB at low frequencies. In order to address this problem, the applicants have proposed to isolate the matching circuits of the balanced antenna 400 and the chassis antenna 100 by introducing the slot 520 in the ground plane 502, as shown in FIG. 36.

Table 8 below shows the simulated reflection coefficient, radiation efficiency, total efficiency and realized gain for the MIMO antenna 500 including the slot 520, as shown in FIG. 36. In this embodiment, the realized gain for the chassis-antenna 100 has been improved by 6.28 dB (79.6%), since it is now −7.89 dB at 687 MHz, without affecting other parameters, simply by including the slot 520.

TABLE 8

Simulated reflection coefficient, radiation efficiency, total efficiency and realized gain for the antenna of FIG. 36

| | | Balanced Antenna | | | | Chassis-Antenna | | | | |
|---|---|---|---|---|---|---|---|---|---|---|
| Capacitor For Balanced Antenna | Frequency (MHz) | Simulated Refl. Coe. (dB) | Simulated Rad. Effic. (dB) | Simulated Tot. Effic. (dB) | Simulated Rlzd. Gain (dB) | Simulated Refl. Coe. (dB) | Simulated Rad. Effic. (dB) | Simulated Tot. Effic. (dB) | Simulated Rlzd. Gain (dB) | Simulated Isolation (dB) |
| 10 pF | 687 | −20.16 | −3.34 | −3.38 | −2.10 | −12.92 | −3.36 | −3.59 | −1.61 | −48.92 |
|  | 1722 | −12.64 | −1.24 | −1.70 | 1.80 | −10.01 | −0.45 | −0.70 | 4.49 | −28.99 |
|  | — | — | — | — | — | — | — | — | — | — |

It is clear from the above that embodiments of the present invention can provide a reconfigurable balanced antenna which can be tuned over a wide range of frequencies (e.g. from 646 MHz to over 3000 MHz) and which can be incorporated along with another antenna into a MIMO antenna structure which has good antenna isolation. The balanced antenna may be able to cover the existing cellular service bands known as DVB-H, GSM710, GSM850, GSM900, GPS1575, GSM1800, PCS1900 and UMTS2100 and is an ideal candidate for MIMO applications, especially in small terminals such mobile devices, laptops and PDAs.

It will be appreciated by persons skilled in the art that various modifications may be made to the above-described embodiments without departing from the scope of the present invention. In particular, features described in relation to one embodiment may be incorporated into other embodiments also.

The invention claimed is:

1. A balanced antenna system comprising a radiator connected to an integrated matching circuit and balun, wherein
   i) the radiator comprises a first radiating element and a second radiating element each having a respective feed line;
   (ii) the matching circuit comprises a first impedance-matching circuit having an input and an output and a second impedance-matching circuit having an input and an output;
   (iii) the balun comprises first and second inputs for input of first and second balanced signals, circuitry to convert the first and second balanced signals to a single unbalanced signal, and a single output for output of the unbalanced signal;
   (iv) the feed line of the first radiating element is connected to the input of the first impedance-matching circuit and the feed line of the second radiating element is connected to the input of the second impedance-matching circuit;
   (v) the output of the first impedance-matching circuit is connected to the first input of the balun and the output of the second impedance-matching circuit is connected to the second input of the balun; and
   (vi) the first and second impedance-matching circuits and the balun are integrated and produce a phase difference of substantially 180° (degrees) between the feed lines of the first and second radiating elements across an operating bandwidth of the antenna system.

2. The balanced antenna system according to claim 1 wherein the balun is configured to convert unbalanced signals to balanced signals by cancelling or choking an outside current.

3. The balanced antenna system according to claim 1 wherein the balun comprises one of a current balun, a coax balun or a sleeve balun.

4. The balanced antenna system according to claim 1 wherein the balun comprises a wideband LC balun, configured for impedance transformation.

5. The balanced antenna system according to claim 1 wherein the balun comprises a first filter and a second filter.

6. The balanced antenna system according to claim 5 wherein a first impedance-matching circuit is provided between the first filter and a first radiating element and a second impedance-matching circuit is provided between the second filter and a second radiating element.

7. The balanced antenna system according to claim 6 wherein the balun comprises a high pass filter comprising the first filter, a low pass filter comprising the second filter and a T-junction.

8. The balanced antenna system according to claim 6 wherein the balun comprises a high pass filter comprising the first filter and a band pass filter comprising the second filter, connected in parallel.

9. The balanced antenna system according to claim 5 wherein the balun comprises a high pass filter comprising the first filter, a low pass filter constituting comprising the second filter and a T-junction.

10. The balanced antenna system according to claim 9 wherein the high pass filter and/or the low pass filter each comprise one or more than one inductor or capacitor.

11. The balanced antenna system according to claim 10 wherein the high pass filter comprises one or more than one capacitor connected in series and no, one or more than one inductor connected in parallel and the low pass filter comprises one or more than one inductor connected in series and no, one or more than one capacitor connected in parallel.

12. The balanced antenna system according to claim 9 wherein a second high pass filter and/or a second low pass filter is provided and at least one switch is provided to enable the second high pass filter and/or the second low pass filter to be activated in place of the respective high pass filter and/or low pass filter.

13. The balanced antenna system according to claim 12 wherein the second high pass filter and/or the second low pass filter comprises an L-C circuit and the second high pass filter comprises three capacitors connected in series and two inductors connected in parallel and the second low pass filter comprises three inductors connected in series and two capacitors connected in parallel.

14. The balanced antenna system according to claim 5 wherein the balun comprises a high pass filter comprising the first filter and a band pass filter comprising the second filter, connected in parallel.

15. The balanced antenna system according to claim 1 wherein the first and/or second impedance-matching circuits are reconfigurable to enable the respective first and/or second radiating elements to be tuned to different frequencies.

16. The balanced antenna system according to claim 15 wherein the first and/or second impedance-matching circuits comprise an L-C circuit comprising a variable capacitor.

17. The balanced antenna system according to claim 15 wherein the first and/or second impedance-matching circuit comprises a first inductor, a capacitor and a second inductor.

18. The balanced antenna system according to claim 17 wherein the first inductor is connected in parallel with the capacitor and the second inductor is connected in series with the capacitor.

19. The balanced antenna system according to claim 18 wherein the first inductor is connected to a ground plane and the capacitor is tunable.

20. The balanced antenna system according to claim 15 wherein at least one alternative component is provided for inclusion in the first and/or second impedance-matching circuit and at least one switch is provided to enable the at least one alternative component to be activated in place of another component.

21. The balanced antenna system according to claim 1 wherein the first radiating element is constituted by a first strip which is substantially U-shaped and is provided on a first side of a substrate at a first end thereof.

22. The balanced antenna system according to claim 21 wherein the U-shaped strip is located in one half of a first end portion of the substrate and is orientated such that its open end faces inwardly towards the central region of the first end portion.

23. The balanced antenna system according to claim 22 wherein a feed line is provided at a start of the U-shaped strip closest to the centre of the substrate and which extends along the length of the substrate.

24. The balanced antenna system according to claim 22 wherein the second radiating element is substantially similar to the first radiating element and is also provided on the first side of the substrate but orientated in an adjacent half of the first end portion of the substrate, opposite to the first radiating element, such that an open end of the second strip faces the open end of the first strip.

25. The balanced antenna system according to claim 24 wherein a gap is provided between the respective feed lines of the first and second radiating elements and between the respective ends of the first and second strips.

26. The balanced antenna system according to claim 21 wherein a ground plane is provided on a second side of the substrate, opposite the first side.

27. An antenna structure for MIMO applications comprising at least one balanced antenna system according to claim 1 and at least one further antenna.

28. The antenna structure according to claim 27 wherein the at least one further antenna comprises a balanced or unbalanced antenna and is reconfigurable.

29. The antenna structure according to claim 27 wherein a first antenna is located at a first end of the structure and a second antenna is located at a second end of the structure.

30. The antenna structure according to claim 27 wherein the at least one further antenna comprises a reconfigurable antenna comprising two or more mutually coupled radiating elements and two or more impedance-matching circuits configured for independent tuning of the frequency band of each radiating element, wherein each radiating element is arranged for selective operation in each of the following states: a driven state, a floating state and a ground state.

31. The antenna structure according to claim 27 wherein the balanced antenna system is isolated from the further antenna by provision of a slot in a ground plane of the antenna structure.

32. The balanced antenna system according to claim 1, wherein the integrated matching circuit and balun comprises at least one variable impedance component actively reconfiguring the integrated matching circuit and balun for different frequencies across the operating bandwidth of the antenna system.

* * * * *